United States Patent
Chanler et al.

(10) Patent No.: US 9,836,243 B1
(45) Date of Patent: Dec. 5, 2017

(54) CACHE MANAGEMENT TECHNIQUES

(71) Applicant: EMC IP Holding Company LLC, Hopkinton, MA (US)

(72) Inventors: Andrew Chanler, Berlin, MA (US); Michael J. Scharland, Franklin, MA (US); Gabriel BenHanokh, Tel-Aviv (IL); Arieh Don, Newton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/086,439

(22) Filed: Mar. 31, 2016

(51) Int. Cl.
G06F 12/00 (2006.01)
G06F 13/00 (2006.01)
(Continued)

(52) U.S. Cl.
CPC .......... *G06F 3/0647* (2013.01); *G06F 3/0611* (2013.01); *G06F 3/0688* (2013.01); *G11C 16/10* (2013.01)

(58) Field of Classification Search
CPC . G06F 3/00; G06F 3/06; G06F 3/0601; G06F 3/0602; G06F 3/061; G06F 3/0611; G06F 3/0613; G06F 3/0614; G06F 3/0616; G06F 3/0617; G06F 3/0619; G06F 3/062; G06F 3/0622; G06F 3/0623; G06F 3/0625; G06F 3/0626; G06F 3/0628; G06F 3/0629; G06F 3/0631; G06F 3/0632; G06F 3/0634; G06F 3/0635; G06F 3/0637;
(Continued)

(56) References Cited

U.S. PATENT DOCUMENTS 7,464,221 B2 * 12/2008 Nakamura ............ G06F 3/0626 711/113
7,949,637 B1 * 5/2011 Burke .................. G06F 3/0605 707/655

(Continued)

OTHER PUBLICATIONS

Differentiated storage services; Mesnier et al; ACM SIGOPS Operating Systems Review, vol. 45, iss. 1; Jan. 2011; pp. 45-53 (9 pages).*

(Continued)

*Primary Examiner* — Daniel C Chappell
(74) *Attorney, Agent, or Firm* — Muirhead and Saturnelli, LLC

(57) ABSTRACT

Described are techniques for caching metadata. At least a portion of the cached metadata may be stored persistently on flash-based storage. A data movement granularity size may be determined in accordance with one or more values including M denoting a number of storage units, or more generally metadata objects, having associated metadata stored in a single cached metadata page. At least a portion of the associated metadata is stored on the flash-based storage. A first data portion selected for data movement may have a size equal to the data movement granularity size. The first data portion has first metadata stored on the flash-based storage. The first metadata may include location metadata updated in connection with data movements performed. In accordance with data movement of the first data portion, the first metadata is updated. In a single write operation, the updated first metadata may be written to the flash-based storage.

19 Claims, 22 Drawing Sheets

(51) Int. Cl.
*G06F 13/28* (2006.01)
*G06F 3/06* (2006.01)
*G11C 16/10* (2006.01)

(58) Field of Classification Search
CPC ...... G06F 3/0638; G06F 3/064; G06F 3/0641; G06F 3/0643; G06F 3/0644; G06F 3/0646; G06F 3/0647; G06F 3/0649; G06F 3/065; G06F 3/0652; G06F 3/0653; G06F 3/0655; G06F 3/0656; G06F 3/0658; G06F 3/0659; G06F 3/0661; G06F 3/0662; G06F 3/0664; G06F 3/0665; G06F 3/0667; G06F 3/0668–3/0686; G06F 3/0688; G06F 3/0689; G06F 2003/0691; G06F 2003/0692; G06F 2003/0694; G06F 2003/0695; G06F 2003/0697; G06F 2003/0698; G06F 2211/00–2211/902; G06F 2212/00–2212/7211; G06F 2213/00–2213/4004; G11C 7/1078; G11C 16/06–16/08; G11C 16/10–16/20; G11C 99/00; G11C 2207/00–2207/229; G11C 2216/00–2216/30

See application file for complete search history.

(56) References Cited

U.S. PATENT DOCUMENTS

| | | | | |
|---|---|---|---|---|
| 9,128,855 | B1* | 9/2015 | Natanzon | G06F 12/0871 |
| 9,177,670 | B1* | 11/2015 | Derbeko | G11C 16/16 |
| 9,229,854 | B1* | 1/2016 | Kuzmin | G06F 12/0246 |
| 9,496,039 | B2* | 11/2016 | Yin | G06F 13/28 |
| 9,513,815 | B2* | 12/2016 | Chang | G06F 3/061 |
| 9,640,264 | B2* | 5/2017 | Kim | G11C 11/5628 |
| 9,645,751 | B2* | 5/2017 | Ryan | G06F 3/0616 |
| 9,734,911 | B2* | 8/2017 | Sinclair | G11C 16/10 |
| 2002/0166022 | A1* | 11/2002 | Suzuki | G06F 12/0866 711/103 |
| 2008/0022163 | A1* | 1/2008 | Tanaka | G06F 11/1068 714/710 |
| 2008/0162795 | A1* | 7/2008 | Hsieh | G06F 12/0866 711/103 |
| 2010/0106890 | A1* | 4/2010 | Lasser | G06F 12/0246 711/103 |
| 2010/0153620 | A1* | 6/2010 | McKean | G06F 11/1466 711/103 |
| 2010/0306452 | A1* | 12/2010 | Weber | G06F 3/0607 711/103 |
| 2011/0145473 | A1* | 6/2011 | Maheshwari | G06F 12/0866 711/103 |
| 2011/0145479 | A1* | 6/2011 | Talagala | G06F 12/02 711/103 |
| 2011/0202708 | A1* | 8/2011 | Ash | G06F 12/0866 711/103 |
| 2011/0296085 | A1* | 12/2011 | Eleftheriou | G06F 12/0246 711/103 |
| 2012/0110247 | A1* | 5/2012 | Eleftheriou | G06F 12/0888 711/103 |
| 2013/0042060 | A1* | 2/2013 | Marukame | G06F 17/30982 711/108 |
| 2013/0166822 | A1* | 6/2013 | Franceschini | G06F 3/0601 711/103 |
| 2013/0205072 | A1* | 8/2013 | Sreekandath | G06F 12/0246 711/103 |
| 2014/0208017 | A1* | 7/2014 | Benhase | G06F 12/0806 711/113 |
| 2014/0215129 | A1* | 7/2014 | Kuzmin | G06F 12/0246 711/103 |
| 2014/0237163 | A1* | 8/2014 | Maharana | G06F 12/0871 711/103 |
| 2014/0344504 | A1* | 11/2014 | Luo | G06F 12/0842 711/103 |
| 2015/0012690 | A1* | 1/2015 | Bruce | G06F 12/0811 711/103 |
| 2015/0089121 | A1* | 3/2015 | Coudhury | G06F 12/0246 711/103 |

OTHER PUBLICATIONS

PLC-cache: Endurable SSD cache for deduplication-based primary storage; Liu et al; 30th Symposium on Mass Storage Systems and Technologies; Jun. 1-6, 2014 (12 pages).*

Dynamic Metadata Management for Petabyte-Scale File Systems; Weil et al; Proceedings of the 2004 ACM/IEEE Conference on Supercomputing; Nov. 6-12, 2004 (12 pages).*

Seamlessly integrating disk and tape in a multi-tiered distributed file system; Koltsidas et al; IEEE 31st International Conference on Data Engineering; Apr. 13-17, 2015; pp. 1328-1339 (12 pages).*

Andrew Chanler, et al., "Optimized Read Processing," U.S. Appl. No. 14/868,499, filed Sep. 29, 2015.

* cited by examiner

CACHE MANAGEMENT TECHNIQUES

BACKGROUND

Technical Field

This application generally relates to caching.

Description of Related Art

Computer systems may include different resources used by one or more host processors. Resources and host processors in a computer system may be interconnected by one or more communication connections. These resources may include, for example, data storage devices such as those included in the data storage systems manufactured by EMC Corporation. These data storage systems may be coupled to one or more host processors and provide storage services to each host processor. Multiple data storage systems from one or more different vendors may be connected and may provide common data storage for one or more host processors in a computer system.

A host may perform a variety of data processing tasks and operations using the data storage system. For example, a host may perform basic system I/O operations in connection with data requests, such as data read and write operations.

Host systems may store and retrieve data using a data storage system containing a plurality of host interface units, disk drives, and disk interface units. Such data storage systems are provided, for example, by EMC Corporation of Hopkinton, Mass. The host systems access the storage device through a plurality of channels provided therewith. Host systems provide data and access control information through the channels to the storage device and storage device provides data to the host systems also through the channels. The host systems do not address the disk drives of the storage device directly, but rather, access what appears to the host systems as a plurality of logical units, logical devices or logical volumes. The logical units may or may not correspond to the actual physical disk drives. Allowing multiple host systems to access the single storage device unit allows the host systems to share data stored therein.

An application may execute on a host where the application performs I/O (input/output) operations issued to the data storage system. In servicing a request, such as a request to read data, the data storage system may utilizing caching. For servicing a read operation, the data storage system may first try to service the read request using data stored in cache. If the requested read data is all in cache, the read may be characterized as a read hit. Otherwise, if the requested read data is not all located in cache, the read may be characterized as a read miss whereby the data storage system may retrieve any portions of the requested data which are currently not stored in cache from physical storage device(s), store the retrieved data in cache, and then return the requested read data to the host. Data which is retrieved from physical storage may be stored in cache for servicing possible future read requests for the same data. In this manner, a first read request that is a read miss results in requested read data being stored in cache whereby a second subsequent read for the same read data now stored in cache results in a cache hit. Such caching techniques are utilized with a goal of increasing performance of the data storage system.

SUMMARY OF THE INVENTION

In accordance with one aspect of techniques described herein is a method of performing data movements comprising: determining a data movement granularity size in accordance with a first set of one or more values including M denoting a number of storage units having associated metadata stored in a single cached metadata page, wherein at least a portion of the associated metadata is stored on one or more physical storage devices each having an expected lifetime based on any of a number of writes and write cycles performed; selecting a first data portion for data movement, the first data portion having a size equal to the data movement granularity size, said first data portion having first metadata stored on the one or more physical storage devices; updating, in accordance with the data movement of the first data portion, the first metadata for the first data portion and generating updated first metadata for the first data portion; writing, in a single write operation, the updated first metadata to the flash-based storage; and performing the data movement of the first data portion. The one or more physical storage devices may be flash-based storage devices. The first set of one or more values may include N and Y, wherein N denotes a number of cached metadata pages having metadata stored in a single flash page and where the single flash page has a size Y denoting a write size granularity of the flash-based storage devices whereby data is written to the flash-based storage devices in chunks each having the write size granularity. The data movement granularity size may be less than Y. The data movement granularity size may be any of: M, and a mathematical product of M*N*I, wherein I is a non-zero integer. The data movement may be a movement of the first data portion in connection with performing any of: a data storage movement optimization that moves the first data portion from a source storage tier to a target storage tier, a data storage service or facility, data replication, creating or maintaining a snapshot, and creating or maintaining a complete physical copy of a primary data entity. The data movement may relocate the first data portion from a first physical location in a first storage tier to a second physical location in a second storage tier. The first metadata may include first location information indicating that the first data portion is located on at the first physical location in the first storage tier, and the updated first metadata may include second location information indicating that the first data portion is located at the second physical location in the second storage tier. The first location information may indicate physical location of the first data portion prior to the data movement and the second location information may indicate physical location of the first data portion after performing the data movement. The first storage tier and the second storage tier may be included in a plurality of storage tiers having a relative performance ranking. The data movement may be any of: a data promotion where the second storage tier has a higher performance ranking than the first storage tier, and a data demotion where the first storage tier has a higher performance ranking than the second storage tier. The first data portion may include a first plurality of data portions and the data movement may include a first plurality of data movements. Each of the first plurality of data movements may move one of the first plurality of data portions from a source storage tier to a target storage tier determined in accordance with an I/O workload of said one data portion. The method may include storing the updated first metadata in a buffer. As each of the first plurality of data movements are performed, corresponding metadata of the buffer for the data movement may be updated. The buffer may have a first size equal to a single flash page. The first size may be a write size granularity in which data is written to the flash-based storage devices. Updating of the buffer may generate the updated first metadata for the first data portion. The updating may commence at a first point in time, and wherein the writing may be performed responsive to an occurrence of a trigger condition that is any of: the buffer reaches a threshold level of metadata updates, and a maximum amount of time has elapsed. Y may be a size of each single flash page of the flash-based storage and may denote a write size granularity of the flash-based storage whereby data is written to the flash-based storage in chunks each having the write size granularity. Each unit of storage of the first portion may have its metadata partitioned into a first part and a second part. The first metadata for the first data portion may be stored in a single first flash page of the flash-based memory. The first metadata may include only the first part for each unit of storage of the first portion and the second part of each unit of storage of the first portion may be stored another form of physical storage other than the flash-based storage devices.

In accordance with another aspect of techniques herein is a computer readable medium comprising code stored thereon that, when executed, performs a method of performing data movements comprising: determining a data movement granularity size in accordance with a first set of one or more values including M denoting a number of storage units having associated metadata stored in a single cached metadata page, wherein at least a portion of the associated metadata is stored on flash-based storage of a metadata cache; determining a total data movement size having a total size that is a least common multiple of "a" and "b", wherein "a" is a number of storage units having metadata stored in a single cached metadata page and "b" is a number of storage units having metadata stored in a single flash page, wherein the single flash denotes an amount of data written to flash-based storage in a single write operation; determining a first plurality of data movements each moving an amount of data equal to the data movement granularity size, said first plurality of data movements having first metadata stored on flash-based storage, said first plurality of data movements moving a total amount of data equal to the total data movement size; updating, in accordance with the first plurality of data movements, the first metadata and generating updated first metadata for the first plurality of data movements, wherein said updating includes accumulating, during a defined time period, updates to the first metadata in a plurality of buffers each having a size of the single flash page; responsive to any of: the defined tine period elapsing and completing updates to the metadata in accordance with the first plurality of movements, writing contents of each of the plurality of buffers in a single write operation to the flash-based storage; and performing the first plurality of data movements. The first metadata may include location information indicating physical storage locations of data moved by the first plurality of data movements.

In accordance with another aspect of techniques herein is a system comprising: a processor; and a memory comprising code stored therein that, when executed, performs a method comprising: determining a data movement granularity size in accordance with a first set of one or more values including M denoting a number of storage units having associated metadata stored in a single cached metadata page, wherein at least a portion of the associated metadata is stored on one or more physical storage devices each having an expected lifetime based on any of a number of writes and write cycles performed; selecting a first data portion for data movement, the first data portion having a size equal to the data movement granularity size, said first data portion having first metadata stored on the one or more physical storage devices; updating, in accordance with the data movement of the first data portion, the first metadata for the first data portion and generating updated first metadata for the first data portion; writing, in a single write operation, the updated first metadata to the flash-based storage; and performing the data movement of the first data portion. The one or more physical storage devices may be flash-based storage devices. The first set of one or more values may include N and Y, wherein N denotes a number of cached metadata pages having metadata stored in a single flash page, and wherein said single flash page has a size Y denoting a write size granularity of the flash-based storage devices whereby data is written to the flash-based storage devices in chunks each having the write size granularity.

BRIEF DESCRIPTION OF THE DRAWINGS

Features and advantages of the techniques herein will become more apparent from the following detailed description of exemplary embodiments thereof taken in conjunction with the accompanying drawings in which.

DETAILED DESCRIPTION OF EMBODIMENT(S)

Figure 1:
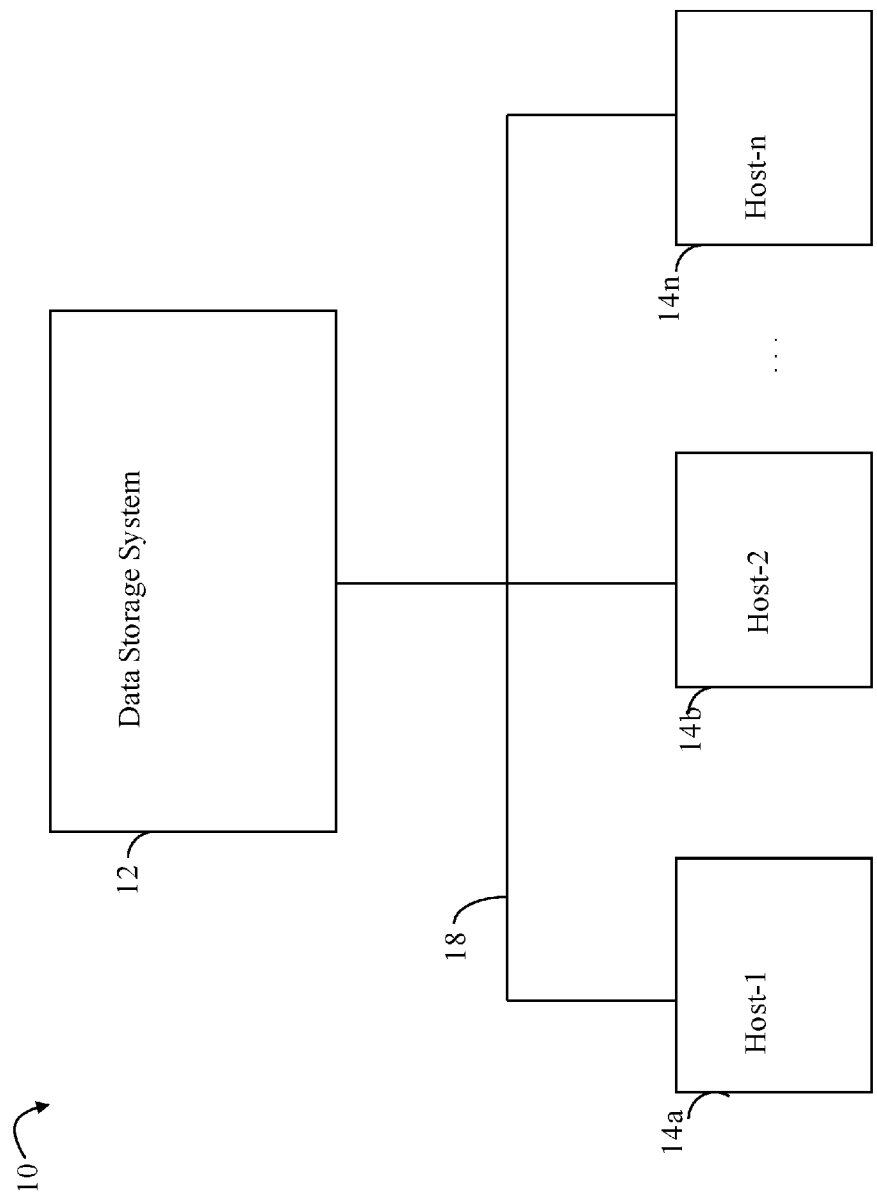
FIG. 1 is an example of an embodiment of a computer system that may utilize the techniques described herein.

Referring to FIG. 1, shown is an example of an embodiment of a system that may be used in performing the techniques described herein. The system 10 includes a data storage system 12, such as a data storage array, connected to host systems 14a-14n through communication medium 18. In this embodiment of the system 10, the N hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be an intranet, network or other wireless or other hardwired connection(s) by which the host systems 14a-14n may access and communicate with the data storage system 12, and may also communicate with others included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particulars of the hardware and software included in each of the components that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as TCP/IP, SCSI (Small Computer Systems Interface), Fibre Channel, iSCSI, Fibre Channel over Ethernet, and the like. Some or all of the connections by which the hosts and data storage system 12 may be connected to the communication medium 18 may pass through other communication devices, switching equipment that may exist such as a phone line, a repeater, a multiplexer or even a satellite.

Each of the host computer systems may perform different types of data operations in accordance with different types of administrative tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12. It should be noted that the data storage system 12 of FIG. 1 may physically be a single data storage system, such as a single data storage array as EMC's Symmetrix® VMAX® data storage system, as well one or more other data storage systems as may vary with the embodiment.

Figure 2A:
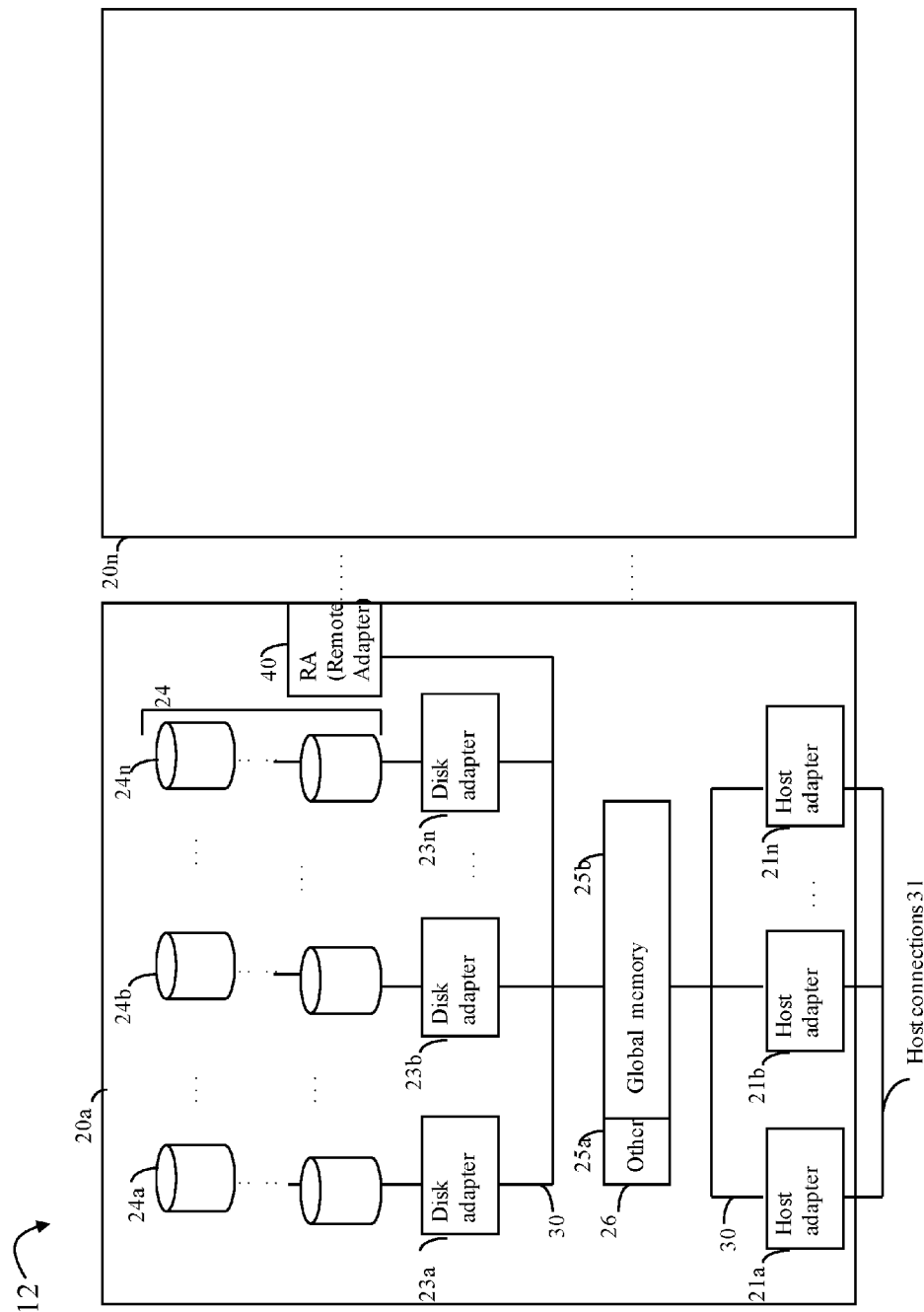
FIG. 2A is an example of an embodiment of a data storage system.

Referring to FIG. 2A, shown is an example of an embodiment of the data storage system 12 that may be included in the system 10 of FIG. 1. Included in the data storage system 12 of FIG. 2A are one or more data storage systems 20a-20n as may be manufactured by one or more different vendors. Each of the data storage systems 20a-20n may be interconnected (not shown). Additionally, the data storage systems may also be connected to the host systems through any one or more communication connections 31 that may vary with each particular embodiment and device in accordance with the different protocols used in a particular embodiment. The type of communication connection used may vary with certain system parameters and requirements, such as those related to bandwidth and throughput required in accordance with a rate of I/O requests as may be issued by the host computer systems, for example, to the data storage system 12. In this example as described in more detail in following paragraphs, reference is made to the more detailed view of element 20a. It should be noted that a similar more detailed description may also apply to any one or more of the other elements, such as 20n, but have been omitted for simplicity of explanation. It should also be noted that an embodiment may include data storage systems from one or more vendors. Each of 20a-20n may be resources included in an embodiment of the system 10 of FIG. 1 to provide storage services to, for example, host computer systems. It should be noted that the data storage system 12 may operate stand-alone, or may also be included as part of a storage area network (SAN) that includes, for example, other components.

Each of the data storage systems, such as 20a, may include a plurality of disk devices or volumes, such as the arrangement 24 consisting of n groupings of disks or more generally, data storage devices, 24a-24n. In this arrangement, each of the n groupings of disks may be connected to a disk adapter ("DA") or director responsible for the backend management of operations to and from a portion of the disks 24. In the system 20a, a single DA, such as 23a, may be responsible for the management of a grouping of disks, such as grouping 24a. In a data storage system such as by EMC Corporation, a backend DA may also be referred to as a disk controller. The DA may performed operations such as reading data from, and writing data to, the physical devices (e.g., physical storage devices also referred to as PDs) which are serviced by the DA.

Also shown in the storage system 20a is an RA or remote adapter 40. The RA may be hardware including a processor used to facilitate communication between data storage systems, such as between two of the same or different types of data storage systems.

The system 20a may also include one or more host adapters ("HAs") or directors 21a-21n. Each of these HAs may be used to manage communications and data operations between one or more host systems and the global memory. In an embodiment, the HA may be a Fibre Channel Adapter (FA) or other adapter which facilitates host communication. Generally, directors may also be characterized as the different adapters, such as HAs (including FAs), DAs RAs and the like, as described herein. Components of the data storage system, such as an HA, which may communicate with a host and receive host data requests such as I/O operations may also be referred to as front end components. A component of the data storage system which communicates with a front end component may be characterized as a backend component, such as a DA. In connection with data storage systems such as by EMC Corporation, various types of directors or adapters may be implemented as a processor, or, more generally, a component that includes the processor. Examples of directors are DAs, HAs, RAs, and the like, such as described herein.

One or more internal logical communication paths may exist between the DAs, the RAs, the HAs, and the memory 26. An embodiment, for example, may use one or more internal busses and/or communication modules. For example, the global memory portion 25b may be used to facilitate data transfers and other communications between the DAs, HAs and RAs in a data storage system. In one embodiment, the DAs 23a-23n may perform data operations using a cache that may be included in the global memory 25b, for example, in communications with other disk adapters or directors, and other components of the system 20a. The other portion 25a is that portion of memory that may be used in connection with other designations that may vary in accordance with each embodiment.

The particular data storage system as described in this embodiment, or a particular device thereof, such as a disk, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the disk drives of the storage systems directly, but rather access to data may be provided to one or more host systems from what the host systems view as a plurality of logical devices or logical units. A logical unit (LUN) may be characterized as a disk array or data storage system reference to an amount of disk space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives. For example, one or more LUNs may reside on a single physical disk drive. Data in a single storage system may be accessed by multiple hosts allowing the hosts to share the data residing therein. The HAs may be used in connection with communications between a data storage system and a host system. The RAs may be used in facilitating communications between two data storage systems. The DAs may be used in connection with facilitating communications to the associated disk drive(s) and LUN(s) residing thereon.

The DA performs I/O operations on a disk drive. Data residing on a disk drive may be accessed by the DA following a data request in connection with I/O operations that other directors originate.

It should also be noted that a DA may also be a controller providing access to external physical drives or storage devices located on one or more external data storage systems rather than local physical drives located in the same physical storage system as the DA (such as illustrated in FIG. 2A).

Figure 2B:
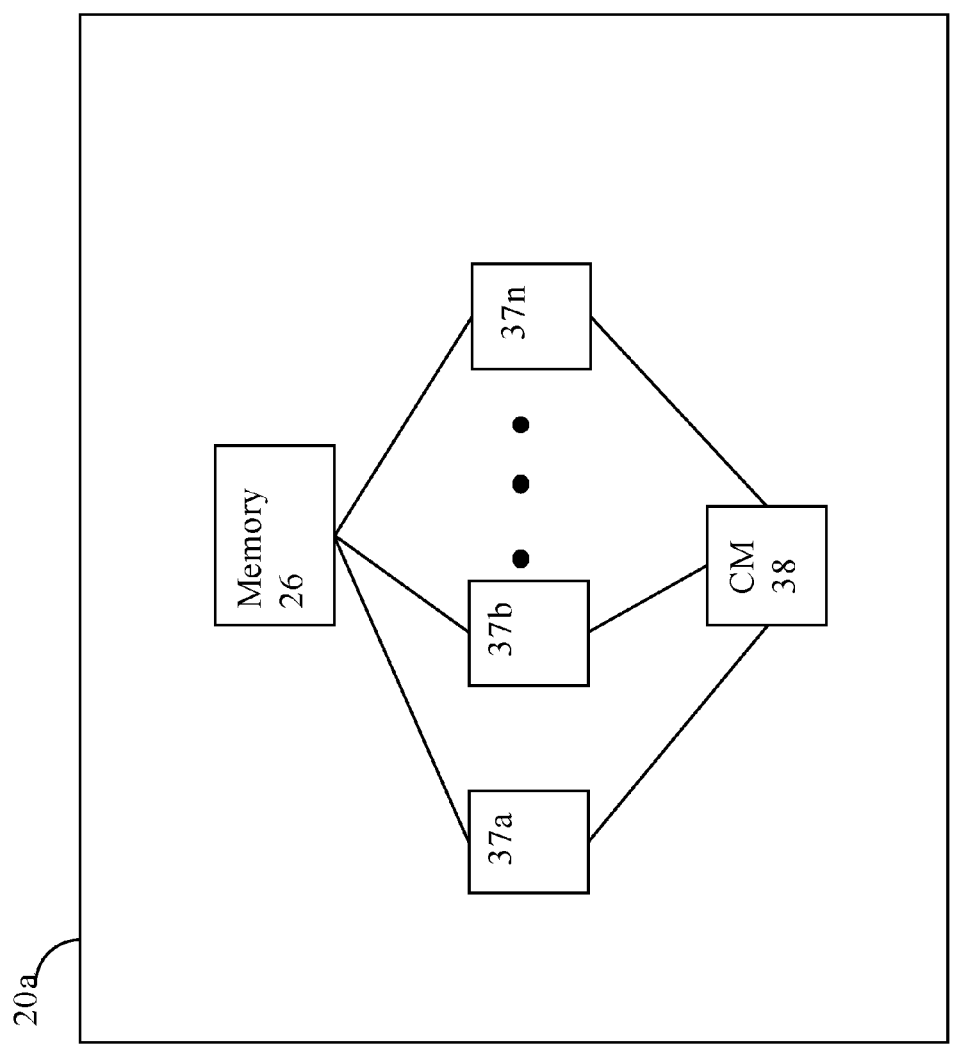
FIG. 2B is a representation of the logical internal communications between the directors and memory included in one embodiment of data storage system of FIG. 2A.

Referring to FIG. 2B, shown is a representation of the logical internal communications between the directors and memory included in a data storage system. Included in FIG. 2B is a plurality of directors 37a-37n coupled to the memory 26. Each of the directors 37a-37n represents one of the HAs, RAs, or DAs that may be included in a data storage system. Each of the directors may be, for example, a processor or a printed circuit board that includes a processor and other hardware components. In an embodiment disclosed herein, there may be up to sixteen directors coupled to the memory 26. Other embodiments may use a higher or lower maximum number of directors that may vary. For example, an embodiment in accordance with techniques herein may support up to 128 directors per data storage system, such as a data storage array. The representation of FIG. 2B also includes an optional communication module (CM) 38 that provides an alternative communication path between the directors 37a-37n. Each of the directors 37a-37n may be coupled to the CM 38 so that any one of the directors 37a-37n may send a message and/or data to any other one of the directors 37a-37n without needing to go through the memory 26. The CM 38 may be implemented using conventional MUX/router technology where a sending one of the directors 37a-37n provides an appropriate address to cause a message and/or data to be received by an intended receiving one of the directors 37a-37n. In addition, a sending one of the directors 37a-37n may be able to broadcast a message to all of the other directors 37a-37n at the same time.

A host may be able to access data, such as stored on a LUN of a data storage system, using one or more different paths from the host to the data storage system. A data storage system device, such as a LUN, may be accessible over multiple paths between the host and data storage system as described in more detail below. Thus, a host may select one of possibly multiple paths over which to access data of a storage device.

It should be noted that the particular exemplary architecture of a data storage system such as, for example, in FIGS. 2A and 2B is merely illustrative of one such architecture that may be used in connection with techniques herein. Those skilled in the art will appreciate that techniques herein may be used with any suitable data storage system. For example, FIG. 2B provides an example of components that may be included in a separate physical fabric used for control communications sent between components of the data storage system. Some embodiments may use separate physical fabrics for each of data movement and control communications between data storage system components. Alternatively, some embodiments may use a same shared physical fabric for both data movement and control communication functionality rather than have a separate control communications fabric such as illustrated in FIG. 2B.

An embodiment in accordance with techniques herein may provide one or more data services or facilities such as related to local replication, remote replication, data storage optimization, and the like. For example, a snapshot facility may be used in an embodiment in accordance with techniques herein. A snapshot may be characterized as a point in time logical image of data. In connection with LUNs, software of a data storage system may provide one or more data replication services or facilities whereby a snapshot is one such facility that may be used to create point in time snapshot of production data for non-disruptive backup. A snapshot may be made with respect to a source LUN thereby providing a point in time image of the source LUN. A snapshot may appear like a normal LUN and may be used for backup, testing, and the like. Snapshots may rely, for example, on copy on first write (COFW) and other techniques to track source LUN changes from the time when a snapshot was created. Any writes to the source LUN may result in processing by snapshot software, for example, to copy the original data prior to changes into another area of storage. With respect to COFW techniques, the COFW occurs only once for each data block modified on the source LUN. Since only changed data blocks of the source LUN are retained rather than make a complete copy of the source LUN, the storage capacity required to implement snapshots may be considerably less than that of the source LUN. Though a LUN snapshot may be presented to a user as a separate LUN along with the current source LUN, a snapshot of a LUN is a virtual point in time copy and requires access to the unchanged data in the source LUN. Therefore failures affecting the source LUN also affect the snapshot of the LUN. Snapshots of a LUN may be contrasted, for example, bit-for-bit replica data copies of a source LUN. Snapshots may be made of a source LUN on demand, according to a schedule, such as daily or at other predefined times, and the like.

In connection with the foregoing, COFW is only one example of technology that may be used in connection with snapshots. More generally, any suitable technique may be used in connection with snapshot creation and techniques described herein. As another example, redirect on Write (ROW) is another technique that may be used in connection with a snapshot implementation, such as in connection with EMC®VNX™ Snapshots. With ROW, after a snapshot is taken, new writes to the primary LUN are redirected (written) to a new location within a storage pool.

An embodiment in accordance with techniques herein may provide for remote replication such providing continuous automated replication. The RA described above may be a component used with the Symmetrix® Remote Data Facility (SRDF®) products provided by EMC Corporation of Hopkinton, Mass. SRDF® is a family of products that facilitates the data replication from one Symmetrix® storage array to another through a Storage Area Network (SAN) or and IP network. SRDF® logically pairs a device or a group of devices from each array and replicates data from one to the other synchronously or asynchronously. Generally, the SRDF® products are one example of commercially available products that may be used to provide functionality of a remote data facility (RDF) for use in an embodiment in connection with techniques herein.

One of the hosts, such as host 14a of FIG. 1, may issue a command, such as to write data to a device R1 of data storage system 12. In some instances, it may be desirable to copy data from the storage device R1 to another second storage device, such as an R2 device provided in another remote data storage system at a different location (not illustrated) so that if a disaster occurs that renders R1 inoperable, the host (or another host) may resume operation using the data of R2 of the remote data storage system. Such a capability is provided, for example, by the SRDF® products provided by EMC Corporation of Hopkinton, Mass. Data storage device communication between Symmetrix® data storage systems using SRDF® is described, for example, in U.S. Pat. Nos. 5,742,792, 5,544,347, 7,054,883, and 8,335,899, all of which are incorporated by reference herein in their entirety. With SRDF®, a user may denote a first storage device, such as R1, as a master storage device and a second storage device, such as R2, as a slave storage device. Other incarnations of SRDF® may provide a peer to peer relationship between the local and remote storage devices. In this example, the host 14a interacts directly with the device R1 of data storage system 12, but any data changes made are automatically provided to the R2 device of a remote data storage system (not illustrated) using SRDF®. In operation, the host 14a may read and write data using the R1 volume in the data storage system 12, and SRDF® may handle the automatic copying and updating of data from R1 to R2 in a remote data storage system.

An embodiment in accordance with techniques herein may be used with SRDF®, or more generally any RDF, operating in one or more different supported modes. For example, such modes may include SRDF® operating in synchronous mode, asynchronous mode, or adaptive copy mode. For example, in connection with SRDF®, the host may issue a write to an R1 device in a first data storage system and the data change is propagated to the R2 device in a second data storage system. As discussed in U.S. Pat. No. 5,544,347, SRDF® can be operated in either a synchronous mode or an asynchronous mode. When operating in the synchronous mode, the host does not consider an operation specified by a command chain to be completed until the command chain has been committed to both the first (primary) and second (remote) data storage systems. Thus, in synchronous mode, the first or source storage system will not provide an indication to the host that the data operation is complete until the first storage system receives an acknowledgement from the second data storage system regarding the data for the R2 device. In contrast, in connection with the asynchronous mode, the host receives an acknowledgement from the first data storage system as soon as the information is committed to the first data storage system without waiting for an acknowledgement from the second data storage system. With synchronous SRDF®, a host cannot proceed to the next I/O until a synchronous SRDF® I/O has completed.

An embodiment in accordance with techniques herein may also support creating a complete physical copy of data storage LUN or other storage entity. The complete physical copy may be a bit for bit replica of the LUN at a point in time.

The foregoing are a few examples of such data services and facilities that may be used in an embodiment in accordance with techniques herein.

Figure 3:
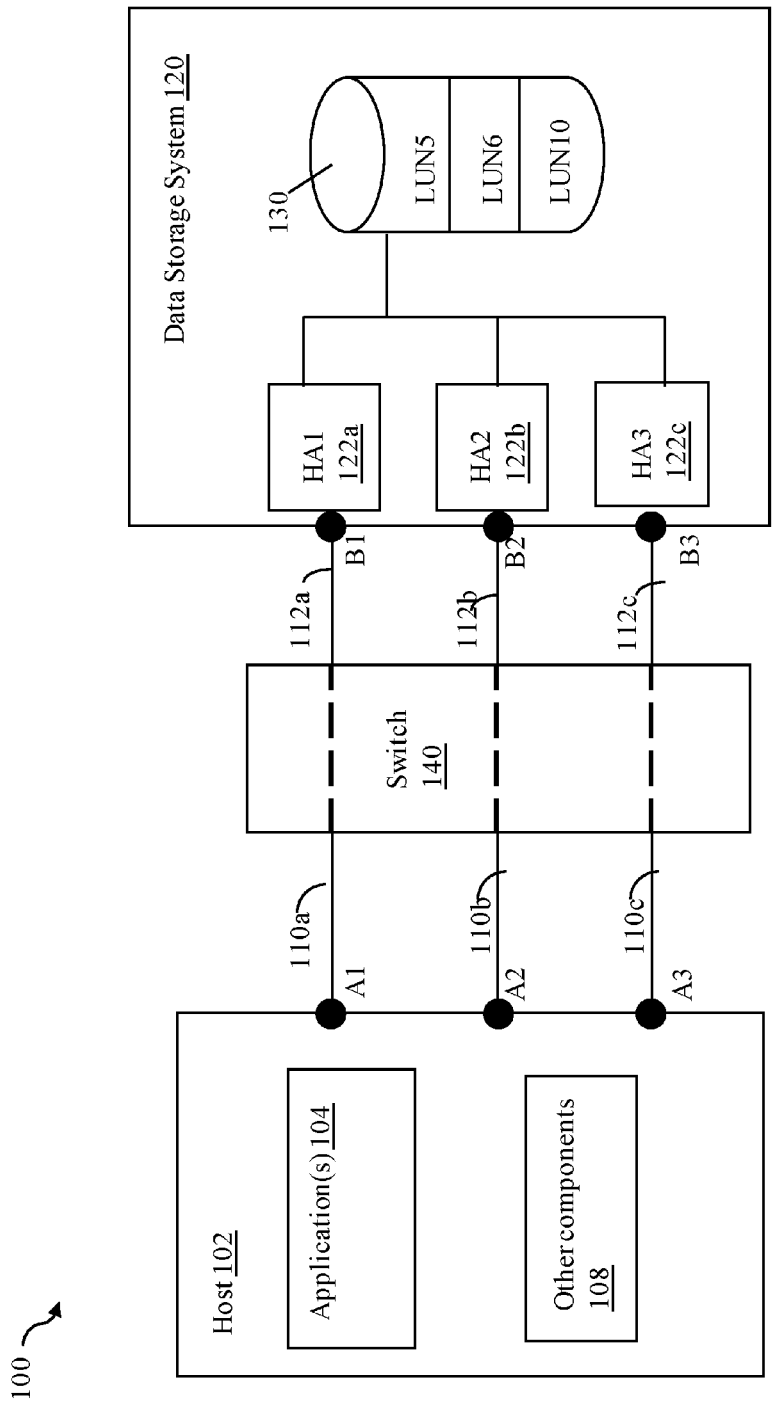
FIG. 3 is an example of a system that may be used in connection with techniques herein.

Referring to FIG. 3, shown is an example of an embodiment of a system that may be utilized in connection with techniques herein. The example 100 includes a host 102, switch 140 and data storage system 120. The host 102 and data storage system 120 may communicate over one or more paths through the switch 140. Elements 110a-110c denote connections between the host 102 and switch 140. Element 112a-112c denote connections between the data storage system 120 and the switch 140. Element 130 may represent a physical storage device of the data storage system 120, such as a rotating disk drive, flash-based storage device, and the like, where the physical storage device 130 may be configured to include 3 LUNs —LUN5, LUN6 and LUN10. It should be noted that the example 100 includes only a single host, single physical device 130 with 3 LUNs, a single data storage system, and a fabric including a single switch for purposes of simplicity to illustrate the techniques herein. For example, each of the LUNs may be configured to have storage provisioned from multiple different physical devices rather than a single physical device, and multiple hosts having multiple applications executing thereon may communicate with the data storage system.

The host 102 may include one or more applications 104 and other components 108 whereby element 108 may include, for example, one or more other device drivers and other code. An I/O operation from the application 104 may be communicated to the data storage system 120 using one or more other components represented by element 108. The application 104 may be a database or other application which issues data operations, such as I/O operations, to the data storage system 120. Each of the I/O operations may be directed to a target device, such as one of the LUNs of device 130, configured to be accessible to the host 102 over one or more physical paths. As such, each of the I/O operations may be forwarded from the application 104 to the data storage system 120 over one of the possible multiple paths.

The host 102 may also include other components 108 such as one or more other layers of software used in connection with communicating the I/O operation from the host to the data storage system 120. For example, element 108 may include Fibre Channel or SCSI drivers, a logical volume manager (LVM), and the like. It should be noted that element 108 may include software or other components used when sending an I/O operation from the application 104.

The data storage system 120 may include one or more physical data storage devices, such as device 130, where each such physical device may be configured to store data of one or more LUNs as described above. Each of the LUNs having data stored on the device 130 may be configured to be accessible to the host through one or more paths. For example, all LUNs of 130 may be accessible using ports of the three front end directors or interfaces 122a-122c, also denoted respectively HA1, HA2 and HA3. The multiple paths allow the application I/Os to be routed over multiple paths and, more generally, allow the LUNs of device 130 to be accessed over multiple paths. In the event that there is a component failure in one of the multiple paths, application I/Os can be easily routed over other alternate paths unaffected by the component failure.

In the example 100, each of the LUNs of the device 130 may be configured as accessible through three paths. Each path may be represented by two path endpoints—a first endpoint on the host 102 and a second endpoint on the data storage system 120. The first endpoint may correspond to a port of a host component, such as a host bus adapter (HBA) of the host 102, and the second endpoint may correspond to a port of a data storage system component, such as a port of an HA of the data storage system 120. In the example 100, elements A1, A2 and A3 each denote a port of a host 102 (e.g. such as a port of an HBA), and elements B1, B2 and B3 each denote a port of an HA of the data storage system 120. Each of the LUNs of the device 130 may be accessible over three paths—a first path represented by A1-B1, a second path represented by A2-B2 and a third path represented by A3-B3.

Figure 4:
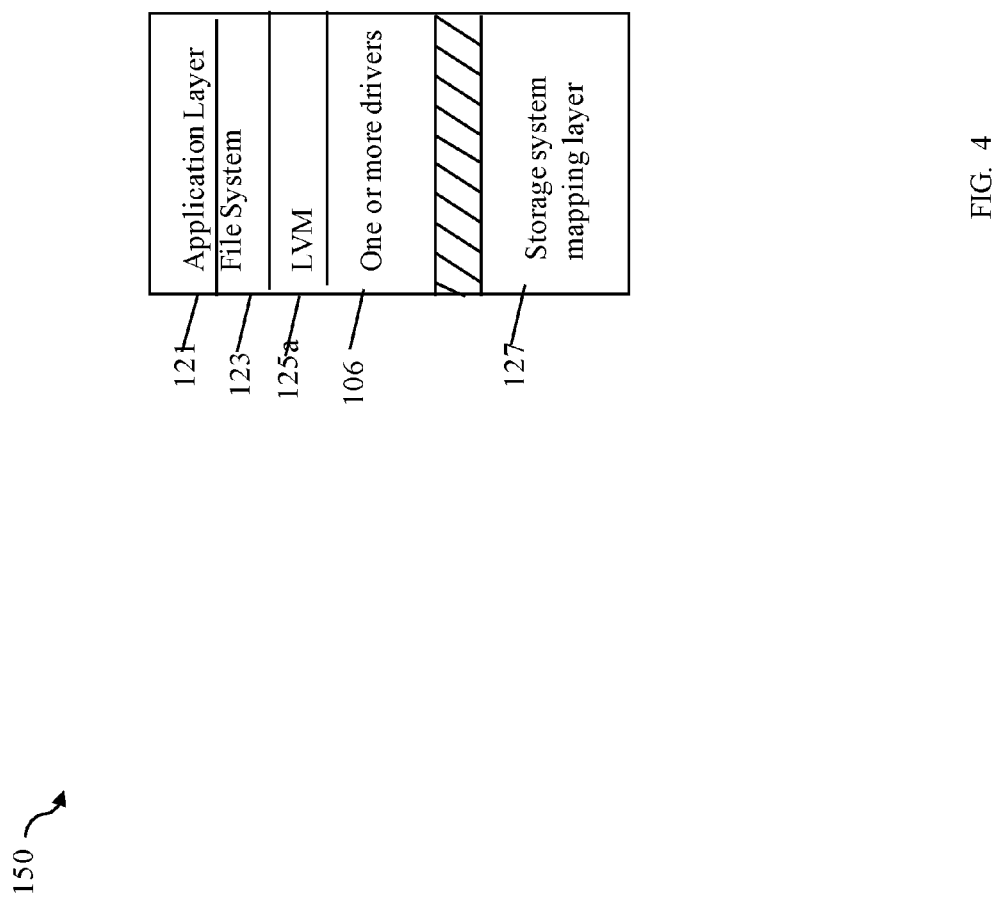
FIG. 4 is an example of different software layers that may be included in a host and data storage system in an embodiment in accordance with techniques herein.

Referring to FIG. 4, shown is a representation of a number of mapping layers that may be included in a computer system, such as host 102 of FIG. 3, in combination with a data storage system. FIG. 4 provides further detail regarding various software layers that may be used in connection with performing a data operation request issued by a host to a data storage system such as illustrated in FIG. 3. The various software layers of 150 may generally form layers included in the runtime I/O stack, such as when an I/O request is issued by an application on a host to a data storage system. The system includes an application layer 121 which includes application programs executing on the host computer 102. The application layer 121 may refer to storage locations using an associated label or identifier such as a file name or file identifier. Below the application layer 121 is the file system layer 123 and the LVM layer 125a that maps the label or identifier specified by the application layer 121 to a LUN which the host may perceive as corresponding to a physical device address (e.g., the address of one of the disk drives) within the storage system 12. Below the LVM layer 125a may be one or more drivers 106 which handle processing of the I/O received from layer 125a. The one or more drivers represented by 106 may include, for example, a SCSI driver (e.g., performs processing for sending requests and receiving responses in accordance with the SCSI standard), a hardware driver (e.g., a driver for an HBA of the host which sends commands or requests to the data storage system and also receives responses and other communications from the data storage system), and the like. Generally, one or more layers between the application layer 121 and the one or more drivers 106 may provide for mapping a LUN (such as used in connection with block-based storage) presented by the data storage system to the host to another logical data storage entity, such as a file, that may be used by the application layer 123.

In some embodiments, the data storage system 120 may be an intelligent data storage system having its own mapping layer 127 such that the LUN known or exposed to the host may not directly correspond to a physical device such as a disk drive. In such embodiments, the LUN provided by the host in connection with the I/O operation may be further mapped by the data storage system using its mapping layer 127. For example, a LUN provided by the host may be mapped by the data storage system to one or more physical drives, multiple LUNs may be located on a same physical device, multiple physical drives, and the like. In other embodiments, the data storage system may not include such a mapping layer 127.

In operation, an application executing at application layer 121 may issue one or more I/O operations (e.g., read and write operations) to logical volumes (implemented by the LVM 125a) or files (implemented using the file system 123) whereby such I/O operation may be then mapped to data operations directed to LUNs of the data storage system. Such I/O operations from the application layer 121 may be directed to the drivers 106 after passing through any intervening layers such as layers 123 and 125a.

In connection with an embodiment in accordance with techniques herein, communications between an initiator port of the host and a target port of a data storage system (e.g., target port of an HA) may include those related to I/O operations and other non-I/O commands such as related to host control operations. I/O operations may include, for example, read and write operations.

In connection with the SCSI standard, a path may be defined between two ports as described above. A command may be sent from the host (as well as a component thereof such as a host bus adapter) and may be characterized as an initiator, originator or source with respect to the foregoing path. The host, as the initiator, sends requests to a data storage system (as well as a particular component thereof such as another HA having a port with a network address) characterized as a target, destination, receiver, or responder. Each physical connection of a path may be between a first endpoint which is a port of the host (e.g., such as of a host bus adapter having ports such as denoted as A1-A3 of FIG. 3) and a second endpoint which is a port of an HA (e.g., such as B1-B3 of FIG. 3) in the data storage system. Over each such path, one or more LUNs may be visible or exposed to the host initiator through the target port of the data storage system.

In connection with a data storage system such as described herein, an I/O request may be a read request to read data. The read request may be received at the data storage system at a port of a front-end component of the data storage system (such as one of the HAs as described elsewhere herein). In terms of processing a read request, a determination may be made as to whether all the requested read data is in cache (e.g., a cache hit). If so, the read request may be characterized as a read hit. In such cases of a read hit, the front-end component, such as the HA, receiving the read request may service the read request by retrieving all requested read data from the cache and returning the requested read data to the host. If all the requested read data is not in cache, the read may be characterized as a read miss (e.g., cache miss) whereby processing is performed to retrieve from physical storage any portion of the requested data that is not currently in cache. As described above, one or more DAs may perform processing to retrieve from physical storage any portion of the requested data not currently in cache. Once all the requested read data is in cache, the front-end component, such as the HA, receiving the read request may service the read request by retrieving all requested read data from the cache and returning the requested read data to the host. In this manner, a front-end component may service read requests using data that is already stored in cache prior to processing the read request, as well as using data that is brought into cache from physical storage responsive to receiving the read request.

Storing such data in cache is performed with the goal of servicing subsequent I/Os using cached data without having to retrieve the data from physical storage. In an embodiment in accordance with techniques herein, processing may be performed as just described to unconditionally cache reads as a result of a cache miss and to execute a dependent sequence of steps whereby the DA writes read miss data (retrieved from physical storage) to cache and the HA then retrieves the requested data from the cache to return to the requesting host.

Figure 5A:
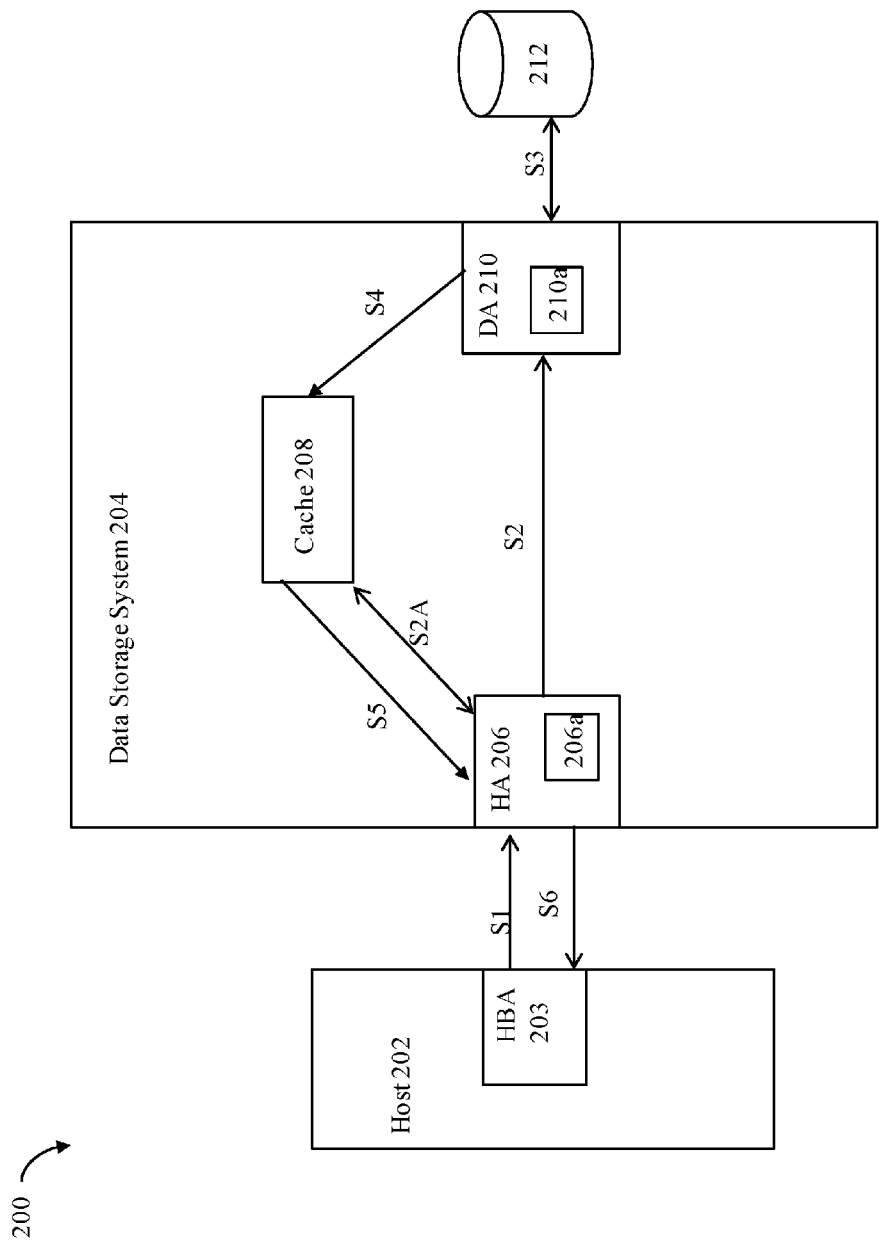
FIG. 5A is an example illustrating processing flow between components of a system in an embodiment in accordance with techniques herein.

Referring to FIG. 5A, shown is an example of a system illustrating processing that may be performed in connection with servicing a read operation in accordance with techniques herein. The example 200 includes host 202 and data storage system 204. The host 202 includes HBA 203. The data storage system 204 includes a front end component, HA 206, which receives I/Os from the host 202. The data storage system 204 also includes DA 210, cache 208 and non-volatile physical storage device 212, such as back-end disk or flash-based drive. Generally, the host 202 and data storage system 204 may include components as described in more detail in connection with other figures herein. Details of other components of 202, 204, and connections therebetween, have been omitted for simplicity of illustration. The cache 208 may be a global data cache used by and between the different components of the system 204, such as by the HAs, DAs, and other components of the system 204 as described herein. Thus, data in the cache 208 may be read from, and/or written to, by different components of the system 204 such as for use with techniques herein as well as other purposes that may vary with embodiment. In one embodiment such as illustrated in FIG. 2A, the cache 208 may be a portion of global memory of the data storage system 204. The HA 206 includes a local memory or buffer 206a used exclusively by the HA 206. For example, if the HA 206 is included on a chip or board of the system 204, element 206a may represent a form of memory included locally on the chip or board accessible only to the HA 206. In a similar manner, the DA 210 may include a local memory or buffer 210a.

As a first step S1, the host 202 sends an I/O request, such as a read request, to the data storage system 204. The read request may be received by HA 206. The HA 206 determines whether all the requested read data is in cache 208 thereby indicating that the read request is a read hit, or otherwise, that the read request is a read miss. If the read request is a read hit indicating that the read request may be serviced using data already in cache 208, the HA 206 retrieves the read request data from the cache 208 in step S2A and returns the requested read data to the host 202 in step S6. Alternatively, if the read request is a read miss, processing may be performed as described in more detail below. The HA 206 may request S2 that a back-end component, such as the DA 210, retrieve the requested data from physical storage device 212. It should be noted that in performing S2, whereby the HA 206 issues the request for the DA 210 to retrieve the requested read data, such a request may be communicated or issued to the DA 210, directly or indirectly, in any suitable manner that may vary with the embodiment of the data storage system. For example, the request may be communicated indirectly, such as through global memory, communicated directly from the HA to the DA such as a through a messaging layer and associated fabric, and the like. In any case, the DA 210 retrieves the requested read data from physical storage device 212 in step S3. The DA 210 may store the read data in a local memory 210a. The requested read data may then be transmitted from 210a of the DA 210 in step S4 to the cache 208. The requested read data is then retrieved by the HA 206 from the cache 208 in step S5. The read data received by the HA 206 in S5 may be stored in local memory 206a of the HA 206. The HA 206 may then return the requested read data to the host 202 in step S6.

In connection with servicing a read operation as received in FIG. 5A, and more generally, I/O operations as well as other processing, a data storage system may utilize metadata (MD) which may be generally characterized as data related to user data. Such user data may be data that is read by a requester, such as a host issuing I/O operations to the data storage system. As described in more detail below, the user data and related MD may be stored on back-end non-volatile storage, such as back-end physical storage devices accessed by the DA. As described below in more detail, portions of user data and related MD may also be stored in a form of faster memory, such as the cache, of the data storage system.

Figure 5B:
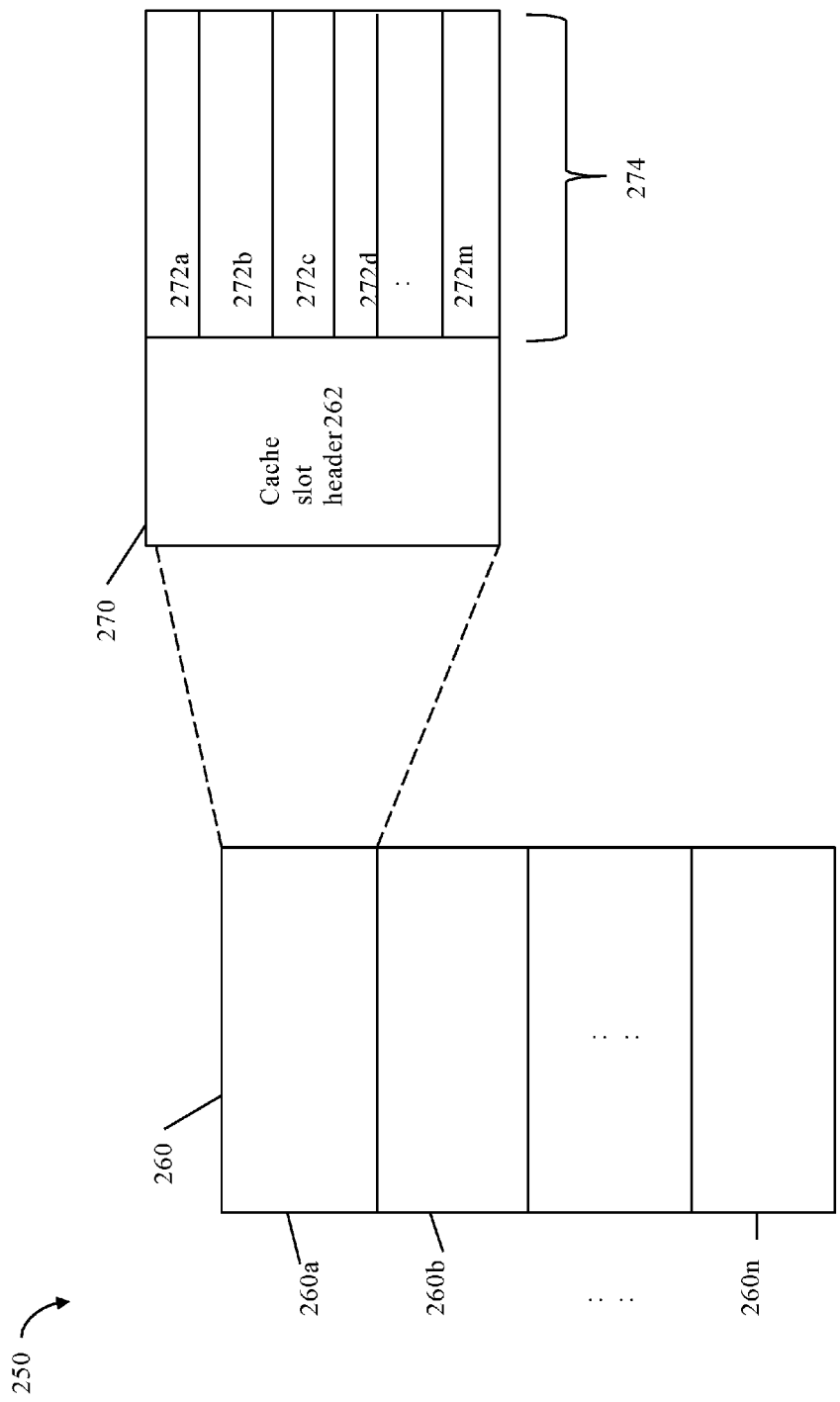
FIG. 5B is an example illustrating a logical representation of a cache in an embodiment in accordance with techniques herein.

Referring to FIG. 5B, shown is an example illustrating a logical representation of a cache that may be used in an embodiment in accordance with techniques herein. In the example 250, element 260 may represent the memory or storage used as the cache which is partitioned into cache slots 260a-260n. It should be noted that the example 250 is a logical representation of a cache that may be implemented using any suitable data structure(s) known in the art. Each of the cache slots 260a-n may contain varying amounts of write pending data. Consistent with description elsewhere herein, write pending data may be user data received in connection with a write operation where the user data has been stored in cache and is waiting to be destaged or written out to physical storage (e.g., element 212 of FIG. 5A) from cache. Element 270 provides additional detail of single cache slot 260a Cache slot 260a may include a cache slot header 262 and cache slot data 274. The cache slot data 274 illustrates that a single cache slot of data may further include multiple portions 272a-m each of which may or may not include write pending data and each of which may or may not include any cached data. The cache slot header 262 may include additional information regarding the cached data stored in 274. For example, the header 272 may denote whether the data cached in each of the portions 272a-m is write pending data.

It should be noted that the particular granularity or smallest unit of storage for storing cached data may vary with embodiment. For example, each of the portions 272a-m may denote a smallest unit of storage for storing cached data. Additionally, the particular number of portions in a cache slot may also vary with embodiment.

Although not illustrated in FIG. 5B for simplicity and as known by those of ordinary skill in the art, an embodiment may store additional information for each of the cache slots regarding the data stored in area 274 of each such cache slot. For example, for a particular LUN and offset, such additional information may map the particular LUN and offset to a cache location containing the data for that LUN and offset. Such additional information may also, for example, map a particular PD and PD offset to a cache location containing the data for that PD and offset. Generally, such additional information may be stored in any suitable location and used, for example, by the HA, DA and other data storage system components and executing code, as an index to map into the cache 260 to retrieve and/or store data from the cache. For example, the HA may manage and/or use information mapping a LUN and LUN offset to a cache location including data stored at the LUN offset on the particular LUN. The DA may manage and/or use information mapping a PD and offset on the PD to a cache location including data stored at the offset on the particular PD. In one embodiment, for example, the foregoing mapping of a LUN location so its physical device location may be included in the location information of MD associated with user data described in more detail elsewhere herein. Additionally, in one embodiment, the size of the area 274 denoting the amount of cached data, such as user data, of a single cache slot may be 128K bytes.

In one embodiment, the user data may be arranged in units of storage, such as tracks of a LUN where each track is of a particular size, such as 128Kbytes of user data per track. For each track, there may exist user data and associated MD.

The MD may be generally partitioned into multiple categories. In one embodiment, the MD categories may include:

1. Location information. Location information may include, for example, the physical device storage location denoting where the user data is stored on physical storage such as disks or flash-based non-volatile storage. Location information may include, for example, cache location information denoting if the user data is stored in cache and if so, identify the location in the cache where the user data is stored.

2. Data Description. Data description information may include, for example, a checksum or other information describing the user data. For example, the checksum may be used to verify or validate the user data's validity when read from physical non-volatile storage, for example, to ensure there has not been user data corruption or error in connection with obtaining the user data from the physical storage. Use of a checksum in data validation and error detection is known in the art. A checksum is a count of the number of bits in a transmission unit that is included with the unit so that the receiver can check to see whether the same number of bits arrived. If the counts match, processing may determine that the complete transmission was received and there has been no error in the data transmitted.

3. Advanced functionality. Advanced functionality MD may relate to other data facilities or services. For example, an embodiment may support remote data replication such as, for example, the Symmetrix Remote Data Facility (SRDF®) products provided by EMC Corporation of Hopkinton, Mass. SRDF® is a family of products that facilitates the data replication from one Symmetrix® storage array to another through a Storage Area Network (SAN) or and IP network. SRDF® logically pairs a device or a group of devices from each array and replicates data from one to the other synchronously or asynchronously. Generally, the SRDF® products are one example of commercially available products that may be used to provide functionality of a remote data facility (RDF) for use in an embodiment in connection with techniques herein.

Data storage device communication between Symmetrix™ data storage systems using the SRDF® product is described, for example, in U.S. Pat. Nos. 5,742,792, 5,544,347, and 7,054,883, all of which are incorporated by reference herein. With the SRDF® product, a user may denote a first storage device, such as R1, as a master storage device and a second storage device, such as R2, as a slave storage device. Other incarnations of the SRDF® product may provide a peer to peer relationship between the local and remote storage devices. For example, the host may interact directly with the device R1 of first local data storage system, but any data changes made are automatically provided to the R2 device of a second remote data storage system using the SRDF® product. In operation, the host may read and write data using the R1 volume in the first data storage system, and the SRDF® product may handle the automatic copying and updating of data from R1 to R2 in second remote data storage system. The SRDF® replication functionality may be facilitated with the RAs provided at each of the foregoing first and second data storage systems. Performing remote data communications using the SRDF® product over a TCP/IP network is described in more detail in U.S. Pat. No. 6,968,369, Nov. 22, 2005, Veprinsky, et al., REMOTE DATA FACILITY OVER AN IP NETWORK, which is incorporated by reference herein.

The advanced functionality MD may denote, for example, whether the user data is replicated by such a data facility such as the SRDF® product, whether the remote or replication copy of the user data is valid or up to date with the primary location copy of the user data, and the like.

Since the MD, such as the location information MD and the checksum or other information of the data description MD, may be needed in connection with servicing I/O operations, the MD may be stored in a form of fast memory or storage. For example, an embodiment may store the MD for as many user data tracks as possible in cache 208, such as a DRAM cache of the data storage system. Thus, storing the MD in cache or other form of fast storage provides for obtaining needed MD, such as location MD, in a timely manner to service I/O operations and other processing in connection with the associated user data.

In one embodiment, the MD as well as the associated user data may be stored on non-volatile back-end storage, such as a rotating disk drive or a flash-based physical storage device accessed by the DA. A copy of the MD may also be stored in the cache 208 that is a form of volatile memory for use as described herein. Thus, the MD may be stored on a form of non-volatile memory, such as backend physical storage, that is typically slower in terms of performance than the volatile memory used as the cache.

As noted above and elsewhere herein, the data storage system may use MD, such as the location information MD, to determine where user data resides on the permanent non-volatile physical storage devices (e.g., as represented by element 212 such as rotating disks, flash-based devices, and the like). With reference back to FIG. 5A, upon receiving a read operation from the host or other requester in S1, all the MD associated with the read operation may be read from physical storage by the DA if such MD is not already in the cache. Once all the MD for the user data requested is currently stored in cache, the data storage system may use the location MD for the user data requested by the read operation to determine whether the requested user data is currently in cache 208 (e.g., resulting in a cache or read hit), or not (e.g., resulting in cache or read miss). If the user data requested by the read operation is not in cache, the data storage system may further allocate a cache location in the cache 208 for storing the requested read miss data, and, using the location MD, obtain the requested read miss user data from its physical device storage location (S3) which is then stored in the allocated cache location (S4). Once the read miss data is read from physical storage in step S3, additional processing may be performed, for example, such as data validity processing, where the user data just read by the DA from back-end physical storage is validated, such as using a checksum or other non-location MD information (e.g., such as included in the data description MD category described above or non-location MD classification described below). Once data validation is complete and successful, the requested read miss data may be stored in cache 208 in step S4 and then obtained by the HA 206 in step S5 to be returned to the host in step S6.

Generally, the amount of MD describing all user data, such as stored on LUNs configured in a data storage system, is large in size. Modern storage systems are capable of storing a large amount of user data and therefore a large amount of MD is needed to describe such user data. Additionally, the complexities of the modern data storage system, such as due to the available data services, may define a feature set requiring a lot of MD to describe each user data track. In some cases, the amount of user data and associated MD make it impractical to store all MD for all user data in cache. In other words, the size of the cache is typically smaller than the amount of cache needed to store all the MD along with storing other necessary data in cache. In this case, a data storage system may use a paging mechanism for storing MD in cache.

Paging is generally known in the art and commonly used in connection with memory management, such as for virtual memory management. In connection with virtual memory management, paging is a method of writing data to, and reading it from secondary storage, such as physical disk or other non-volatile storage, for use in primary storage, such as main memory. In a memory management system that takes advantage of paging, the operating system reads data from secondary storage in blocks or chunks that may also be referred to as pages. Since the amount of the primary storage is typically much smaller than the amount of data on secondary storage, it is not possible to store all such data in the primary storage. Thus, data may be read from secondary storage and stored in the primary storage as needed. When the primary storage no longer has available locations and another primary storage location is needed for storing new or additional data not already in primary storage, techniques may be used to select a primary storage location whereby any data in the selected primary storage location may be overwritten with the new or additional data. Prior to overwriting the selected primary storage location with the new or additional data, the current data of the selected primary storage location may be written out, as needed, to its corresponding secondary storage location (e.g., written out if the primary storage location copy is more recent or up to date than the secondary storage copy). In such a case, the current data in the selected primary location may be characterized as paged out of the primary memory (e.g., available on secondary storage but not primary storage) and the new or additional data may be characterized as paged in to the primary memory. The new or additional data is also stored on the secondary storage.

In connection with storing MD in the cache in an embodiment of a data storage system, paging may be performed in a similar manner where the primary storage is the cache and the secondary storage is the physical storage device (e.g., disk or flash-based non-volatile backend storage accessed by the DAs). Thus, MD may be retrieved from back-end physical storage as needed and stored in cache, such as for servicing read operations requesting user data associated with the MD. Once the MD is in cache, such MD may be removed from cache (e.g., evicted, removed, overwritten, and the like) as cache locations storing such MD are needed in connection with other processing.

It should be noted that storing the MD on back-end physical storage which is read and/or written to physical storage by the DA is one possible way in which an embodiment in accordance with techniques herein may store and access MD on a form of non-volatile storage. More generally, an embodiment may store the MD on any form of non-volatile storage and access such MD as needed in any suitable manner. For example, in at least one other embodiment in accordance with techniques herein, the MD may be stored on a non-volatile storage that is a form of flash-based physical storage included in memory cards, such as flash SLICs, of the data storage system. In such an other embodiment, each of the directors or adapters (e.g., HAs, DAs, etc.) may access MD as needed from the flash SLICs. For example, each HA and DA may access the MD from a flash SLIC as needed by directly accessing the flash SLIC rather than obtaining such needed MD through the DA (as in the former embodiment noted above). Thus, for purposes of illustration, following paragraphs may refer to one particular embodiment in which the MD is stored on non-volatile back-end storage and retrieved by the DA. However, it will be appreciated by those skilled in the art that techniques described herein are not so limited to embodiments described herein for purposes of illustration and example.

In some data storage systems not utilizing techniques described herein, for a user data portion such as a track of user data, all the related MD (e.g., all of the MD for all 3 categories described above) may be either located in cache or none of the related MD may be located in cache. Thus, in such systems not using techniques herein, the MD for user data may be accordingly all paged in or all paged out of cache as a single unit. As a result, when a read request is received and the related MD for the requested read data is currently paged out or not in cache, servicing the read (e.g., read hit or miss) first requires reading the associated MD into cache (e.g., page in the associated MD) to determine whether the requested read data is in cache or not. Additionally, if the requested read data is not in cache and is therefore a read miss, the MD is further needed to determine the back-end physical storage location from which to obtain the read miss data, perform data validation, and the like. Thus, I/O processing and performance, such as for read processing, may be adversely impacted when the MD related to the user data of such I/Os is not currently in cache (e.g., MD is paged out of cache).

An embodiment may use techniques described herein in following paragraphs to minimize the adverse I/O performance impact of paging MD into cache such as may be performed in connection with servicing a read miss I/O operation when the MD needed for servicing the read miss is not currently in cache. As described in more detail below, the MD for a track or other user data portion may be generally partitioned into two classifications. A first MD classification may include only the location information category MD as described elsewhere herein. The second MD classification (also referred to as non-location MD) may generally include all remaining MD information, such as the data description MD and advanced functionality MD categories described elsewhere herein. As described in more detail in following paragraphs, location MD for selected LUNs may be cache-resident and not subject to being paged out. Additionally, for a read miss where the non-location MD for the read miss data is also not currently in cache, processing may be performed to concurrently issue (e.g., substantially at the same time and in parallel) read requests to the DA to retrieve from physical storage both the read miss data and the non-location MD for the read miss data.

In one embodiment in accordance with techniques, the location information category of MD, the first classification of location MD, may be stored in cache for all active configured LUNs (e.g., LUNs which are "in use" such as for a defined activity period when it is known that I/O operations will be directed to such LUNs). In accordance with a first policy implemented in one embodiment, such location MD of the first classification for all active LUNs may not be paged out (e.g., may remain resident in cache). However, non-location MD of the second classification for user data of active LUNs may be paged out and not remain resident in cache. For example, the cache resident location MD may include location MD of active LUNs used by an application, process or data service currently executing (or about to commence execution) on the data storage system. The foregoing and other features of techniques herein are described in more detail in following paragraphs.

Figure 6:
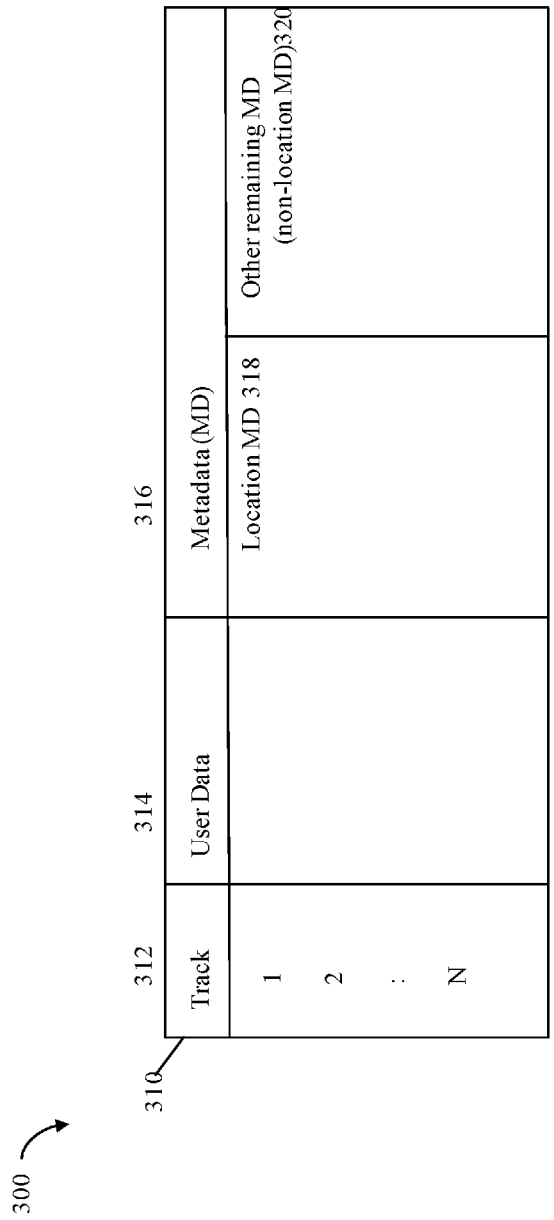
FIGS. 6 and 7 are example illustrating user data and associated metadata that may be used in an embodiment in accordance with techniques herein.

Referring to FIG. 6, shown is an example of a logical representation of user data and associated MD in an embodiment in accordance with techniques herein. The example 300 illustrates information that may be stored and maintained in an embodiment in accordance with techniques herein. For example, assume LUN A includes N tracks of user data and table 310 may denote a logical representation of information stored in connection with LUN A. Column 312 denotes the N tracks. Column 314 denotes the user data for each of the N tracks. Column 316 denotes the MD for the N tracks of user data in column 314. Additionally, consistent with description elsewhere herein, the MD 316 is further partitioned into two classifications—location MD 318 and all other remaining MD (also referred to as non-location MD) 320.

The information of 310 may be stored, for example, in one or more other suitable arrangements. For example, as will be described in more detail below, an embodiment may store both the user data 314 and associated MD 316 on physical non-volatile storage (e.g., back-end physical storage devices such as rotating disk drives or flash-based drives as indicated by the location MD). As I/O operations directed to various locations on LUN A are issued, the cache may become populated with various tracks, or portions thereof, of user data 314. Additionally, the cache may be populated with various portions of the MD 316 as described in more detail below.

Figure 7:
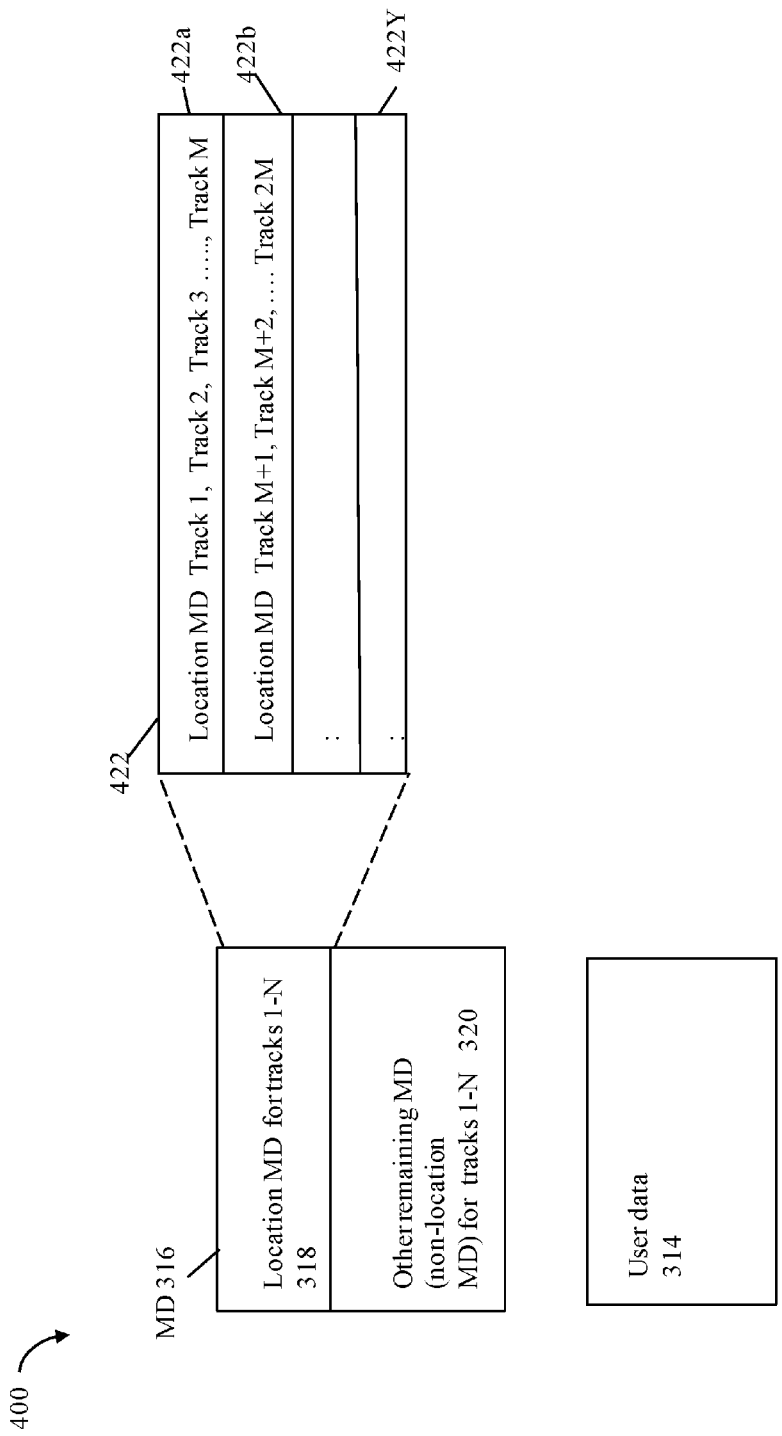

Referring to FIG. 7, shown is an example illustrating one arrangement of the user data and associated MD in an embodiment in accordance with techniques herein. The example 400 illustrates one way in which the user data and MD may be organized and stored on physical non-volatile storage of the back-end for the single LUN A. In at least one embodiment, the user data 314 of LUN A may be stored and organized as a first grouping of information separate from the associated MD 316. The MD 316 may further be arranged such that the location MD 318 for tracks 1-N is stored as a first portion followed by other remaining non-location MD 320 for tracks 1-N.

Element 422 further illustrates how the location MD 318 may be further arranged Element 422 includes Y chunks 422a-422Y of location MD where each of the Y chunks includes location MD for M tracks. For example, location MD chunk 422a includes location MD for tracks 1-M, location MD chunk 422b includes location MD for track M+1 through track 2M, and so on. In one embodiment, each of the chunks 422a-422Y may be the size of a single cache slot or cache location having a size equal to the cache allocation unit. Thus, as described in more detail below, each of the chunks 422a-422Y may denote a portion of location MD for multiple tracks as may be stored in a single cache slot allocated for use in accordance with techniques herein. Thus, each chunk of 422 includes location MD for multiple tracks which are logically consecutive tracks of the same LUN. As described in more detail below, location MD may be retrieved and stored in cache in chunks so that rather than retrieve only a single track of location MD, location MD is obtained for all tracks in the same chunk. For example, if location MD is needed for track 1 and currently not stored in cache, location MD for all M tracks in 422a may be retrieved from back-end non-volatile physical storage and stored in cache.

Although the foregoing of FIGS. 6 and 7 is illustrated for a single LUN A, similar information may be stored on physical non-volatile storage of the back-end for each configured or provisioned LUN in the data storage system.

In an embodiment in accordance with techniques herein, location MD for one or more LUNs may be stored in cache and designated as cache resident whereby such location MD of the LUNs is not paged out of cache and remains in cache. Such cache resident status for the location MD of one or more LUNs may be specified for a defined time period, may always be designated as cache resident for particular LUNs, and the like, as may vary with embodiment.

Figure 8:
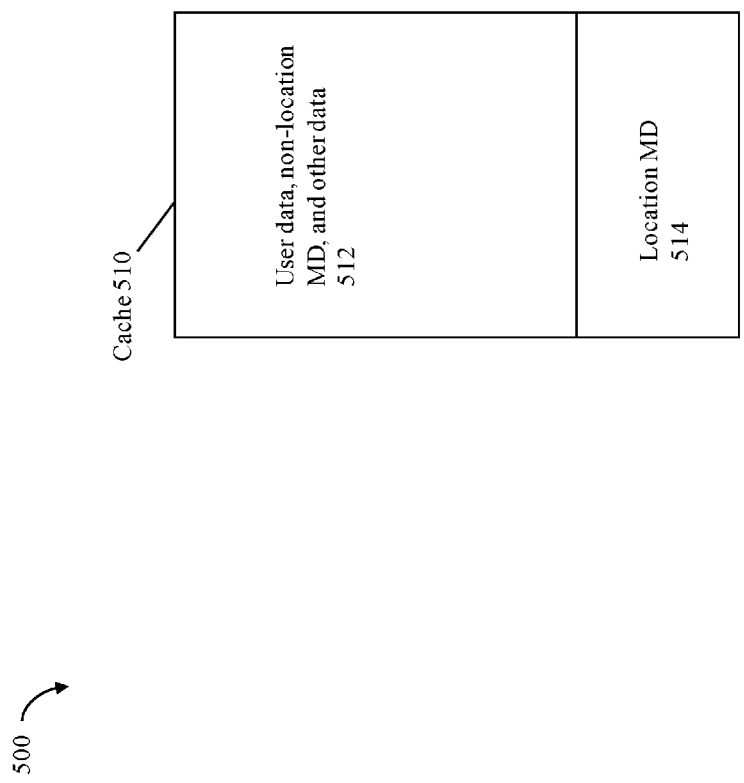
FIGS. 8 and 9 are examples illustrating metadata and user data stored in cache in embodiments in accordance with techniques herein.

Referring to FIG. 8, shown is an example illustrating information that may be stored in cache in an embodiment in accordance with techniques herein. Assuming there is a sufficient amount of cache, location MD for a set of one or more LUNs designated as active or in-use may remain cache resident. Remaining non-location MD for the set of one or more LUNs which are active is not designated as cache resident. Such non-location MD may or may not be in cache at any particular time and may be paged out of cache, for example, depending on the amount of remaining cache not storing location MD. In such an embodiment, the location MD may be stored in a portion of cache separate from other non-location MD. For example, in one embodiment, the location MD for a particular track may be stored in a first cache slot used to store multiple sets of location MD for multiple tracks of user data. If the non-location MD for the particular track is stored in cache, then the non-location MD may be stored in a second cache slot different from the first cache slot.

The example 500 includes cache 510 with a first cache portion 514 including the cache resident location MD for the active LUNs. Element 512 may denote the remaining second portion of cache used for storing user data, non-location MD and other data that may be used in an embodiment in accordance with techniques herein. The second portion 512 of the cache may include, for example, the non-location MD for the active LUNs having their location MD stored in 514 as cache resident. The location MD for a LUN may be loaded into portion 514 of the cache, for example, once a LUN becomes active, immediately prior to a designated active use period, or may be brought into cache in chunks as I/O operations directed to different portions of the LUN are received. However, the LUN's non-location MD may or may not be currently in cache may also not be marked as cache resident. Thus, information such as the LUN's non-location MD in the second cache portion 512 may be evicted, overwritten or otherwise paged out as additional cache locations of 512 are needed for processing I/O operations and/or performing other processing on the data storage system.

In one embodiment, for an I/O operation directed to a particular track of user data, location MD for the particular track may be read from the non-volatile physical storage (e.g., disk or flash-based storage) into cache if the location MD is not already in cache when the I/O operation is received. In a similar manner, non-location MD for the particular track may be read from the non-volatile physical storage (e.g., disk or flash-based storage) into cache if the non-location MD is not already in cache when the I/O operation is received. Once location MD is stored in cache for a LUN designated as active or in use, such location MD may remain resident in the cache and not subject to being paged out. In contrast, the non-location MD may be paged out of cache since it is not designated as cache resident.

In one embodiment, the location MD stored in cache portion 514 may be organized in a manner similar to that as illustrated by element 422 of FIG. 7. With reference back to FIG. 7, in one embodiment, location MD for multiple tracks may be stored in chunks such that a single chunk includes location MD for multiple tracks which may be logically consecutive tracks of the same LUN. Each chunk may be the size or granularity of a single cache slot allocated for caching data. Thus, location MD may be read from physical non-volatile storage devices into cache in chunk size units. For example, in one embodiment, assume that location MD for track 1 is needed to process a read operation directed to track 1. In response, a chunk of location MD including location MD for track 1 and also neighboring tracks may be read from physical non-volatile storage into cache. For example, the location MD for the entire chunk 422*a* may be read from physical non-volatile storage into cache. Thus, the location MD for track 1 may be stored in a first cache slot in cache portion 514 and the non-location MD for track 1 may be stored in a second cache slot in cache portion 512 along with at least a portion of the user data for track 1.

To further illustrate an active or in-use status associated with a LUN, consider the following. For example, a data service or facility such as backup processing may be performed where a set of LUNs on the data storage system are designated as target devices to which data is being backed up (e.g., such as backing up data stored on a host to the target LUNs, backing up data to the target LUNs from other source LUNs stored on the data storage system or elsewhere). In such a case, software for the backup data service may provide an indication or hint that backup processing is about to commence for the set of target LUNs. In response to receiving such an indication or hint prior to the backup beginning, the data storage system may perform processing to mark all location MD for the target LUNs as cache resident. Additionally, if such location MD is currently not in cache, the processing may include retrieving the location MD for the target LUNs. Thus, the location MD for the target LUNs, while active or in use such as during the backup processing, may be cache resident and may not be paged out of cache. Once the time period for backup processing has completed whereby the target LUNs are characterized as no longer active or in use, the location MD for such target LUNs may no longer be designated as cache resident and may be paged out of cache. Thus, the location MD for the target LUNs may be designated as cache resident for defined periods of active use in accordance with a backup process or defined backup schedule.

In one embodiment, each single LUN may be associated with an attribute denoting whether the LUN is active or in-use, or is otherwise inactive or not in-use. When the attribute indicates the LUN is active, the location MD for the LUN may be marked as cache resident and not subject to paging out of cache while the attribute indicates the active status. When the attribute indicates the LUN is inactive or not in use, the location MD for the LUN may not be marked as cache resident and is subject to paging out of cache. An embodiment may also or alternatively include support for associating the foregoing attribute with a defined group of more than one LUN whereby the attribute setting is applied to all LUNs in the group. In other words, rather than have the active/inactive status associated per LUN, a single attribute setting may be specified for the LUN group whereby when the attribute is active, location MD for all LUNs in the LUN group is marked as cache resident, and otherwise, when the attribute for the LUN group is inactive, the location MD for all LUNs in the group is marked as not cache resident. In a similar manner, such an active attribute may be more generally provided in a system for any suitable level of granularity which is per LUN, for a group of LUNs, and/or for portions of less than a single LUN (e.g., defined per group of tracks of a LUN). Thus, the use of such an attribute provides a way in which an embodiment may selectively and dynamically cause related location MD of one or more particular LUNs to be cache resident.

More generally, such an attribute may be set to denote whether to mark location MD of particular LUN(s) as cache resident. Varying the attribute setting based on active or inactive use time periods is one such way in which the attribute may be dynamically modified. As another variation, an embodiment may designate as cache resident one or more LUNs storing data for a particular high priority application. Thus, the foregoing attribute may be set to indicate cache residency for location MD for those LUNs based on the application priority. In one embodiment, a user may specify an associated priority for provisioned LUNs whereby if the priority specified is high, the foregoing attribute for the LUNs may indicate that the location MD for the LUNs is cache resident.

In the foregoing example of FIG. 8, the particular size of 514 may vary depending on the number of LUNs which are active or otherwise have their associated attributes set to indicate that the associated location MD for such LUNs is cache resident.

Figure 9:
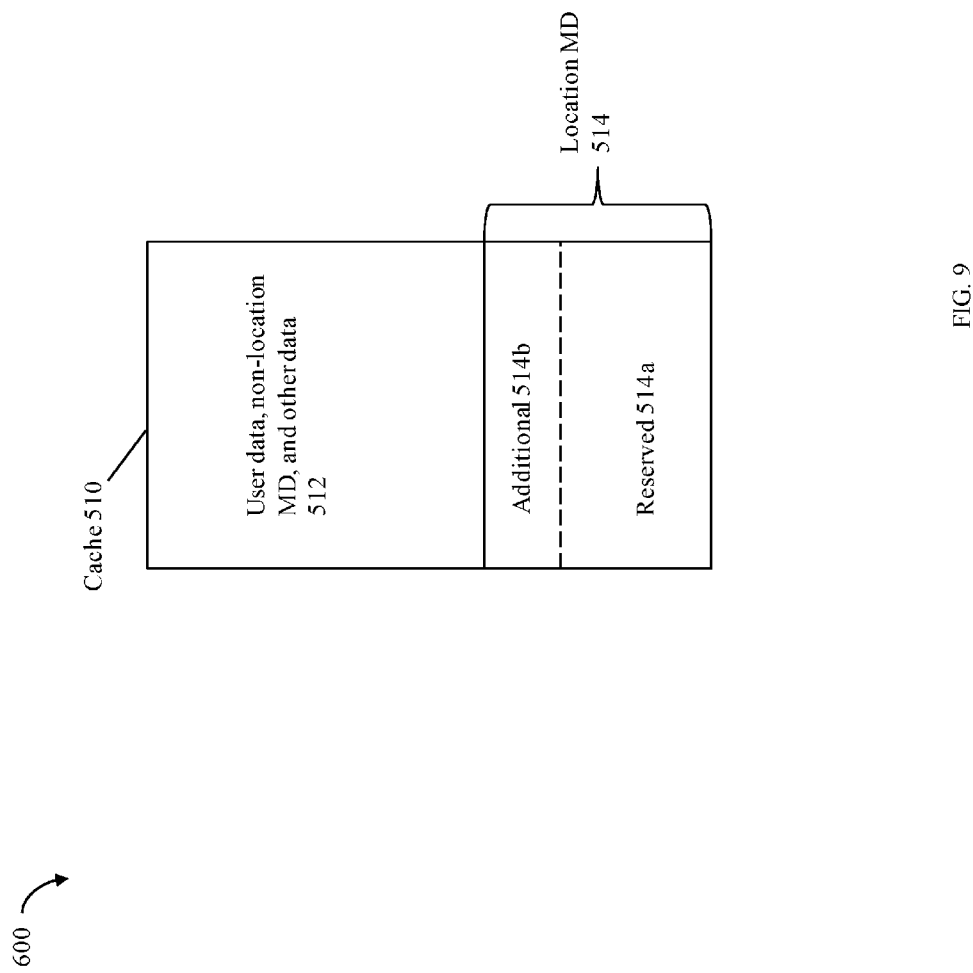

In order to ensure that at least a minimum amount of the cache is used for storing location MD, an embodiment may designate a specified amount of the cache as reserved for storing location MD as further illustrated in FIG. 9.

With reference to FIG. 9, the example 600 further illustrates the location MD 514 being stored in a reserved segment 514*a* and an additional segment 514*b*. The reserved segment 514*a* may denote the size of the reserved cache portion for storing memory resident location MD. In one embodiment, the reserved cache portion 514*a* may be used exclusively for storing memory resident location MD. As illustrated, location MD 514 may be also stored in additional segment 514*b* of cache besides the reserved cache portion 514*a* (e.g., when the amount of location MD exceeds the size of the reserved segment 514*a*). Thus, use of such a reserved portion of cache 514*a* ensures that at least the amount of location MD of the reserved portion size is cache resident and will not be paged out while the attribute(s) associated with such location MD (as stored in 514*a*) indicates that such location MD should be memory resident. In this example, the location MD stored in the additional segment 514*b* may be paged out even though the attribute(s) associated with such location MD indicates that such location MD of 514*b* should be memory resident. Thus, such an embodiment implement a policy where location MD may be stored in the reserved segment 514*a* as well as other portions of the cache 510. However, only the location MD stored in the reserved segment 514*a* may be guaranteed as cache resident and will not be paged out of cache. Location MD stored in the additional segment 514*b* may be paged out of cache as needed in connection with processing performed by the data storage system.

An embodiment may also implement a policy that the reserved segment 514*a* may be temporarily used for storing other data, such as non-location MD, if not all of the reserved segment 514*a* of cache is currently used for storing location MD. However, any other non-location MD in the reserved segment 514*a* will be paged out in the event that additional location MD is to be stored in cache. In other words, when there is an unused section of the reserved segment 514*a* whereby the unused section is not currently storing location MD, the unused section may be used for storing other information, such as non-location MD.

In an embodiment in accordance with techniques herein, a read I/O operation may be received. If the location MD for the read I/O operation is currently not in cache, processing may be performed to retrieve the location MD from physical non-volatile back-end storage into cache. It may be that the read I/O operation is a read miss for the user data and also a cache miss with respect to the non-location MD. As described herein, the non-location MD may be needed in connection with servicing the read operation such as, for example, in connection with performing data validation of the read miss data once obtained from physical storage. In order to minimize the adverse impact upon I/O performance if the read results in a read miss for the user data and further results in a cache miss with respect to the non-location MD for the requested read, an embodiment in accordance with techniques herein may concurrently issue a first read request to the DA to read the user data from the physical storage device (of the back-end) and also issue a second read request to the DA to read the non-location MD for the read miss data from the physical storage device (of the back-end).

Figure 10:
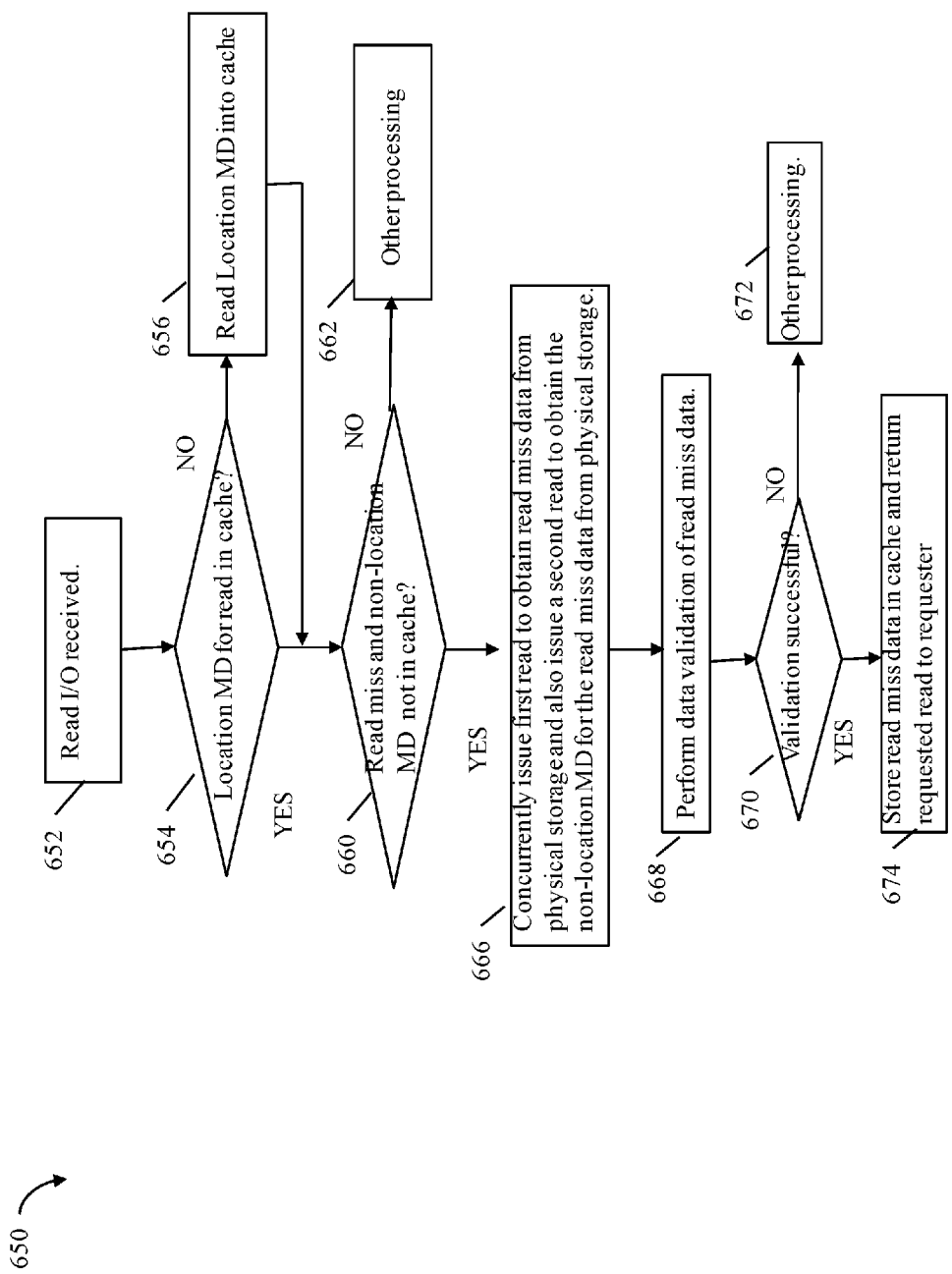
FIGS. 10, 11, 13, 19 and 20 are flowcharts of processing steps that may be performed in an embodiment in accordance with techniques herein.

Referring to FIG. 10, shown is a first flowchart of processing steps that may be performed in an embodiment in accordance with techniques herein. The steps of the flowchart 650 summarize processing as described herein. In step 652, a read I/O operation is received by the data storage system. The read operation may be directed to read user data located at a particular target location, such as a particular track or offset in a track, on a LUN. At step 654, a determination is made as to whether the location MD for the read target location is currently in cache. If step 654 evaluates to yes, control proceeds directly to step 660. If step 654 evaluates to no, control proceeds to step 656 to issue a request to the DA to read from physical storage the location MD and store such location MD into cache. It should be noted that step 656 may include reading into from physical storage and storing into cache other location MD of neighboring tracks. For example, as described herein, steps 656 may include reading a chunk of location MD including location MD for multiple tracks denoting a logical range of consecutive tracks of the LUN to which the read is directed. From step 656, control proceeds to step 660.

At step 660, a determination is made as to whether the current read operation is a read miss and also whether the non-location MD for the target location of the read operation is currently not in cache. If step 660 evaluates to no, control proceeds to step 662 to perform other processing to service the read operation. If step 660 evaluates to yes, control proceeds to step 666. At step 666, processing is performed to concurrently issue a first read to obtain the read miss data from physical storage and also issue a second read to obtain the non-location MD for the read operation or read miss data from physical storage. At step 668, processing may be performed to validate the read miss data obtained from physical storage. As described elsewhere herein and known in the art, such data validation processing may include, for example, performing error checking of the read miss data obtained from physical storage in connection with the first read. Such data validation may, for example, use a checksum or other information included in the non-location MD obtained in connection with the second read. Thus, the non-location MD obtained with the second read may generally include information used in connection with performing data validation of the read miss data of the first read. It should be noted that an embodiment may generally use any suitable technique and associated information in connection with data validation of the read miss data.

At step 670, a determination is made as to whether the data validation is successful. If not whereby step 670 evaluates to no, control proceeds to step 672 to perform other processing. It should be noted that step 672 may include, for example, re-reading the read miss data from physical storage and repeating data validation processing. More generally, step 672 may include any suitable error recovery, may include retrying the operation, and the like.

If step 670 evaluates to yes, control proceeds to step 674 where the validated read miss data is stored in cache and returned to the requester that issued the read operation received in step 652.

Figure 11:
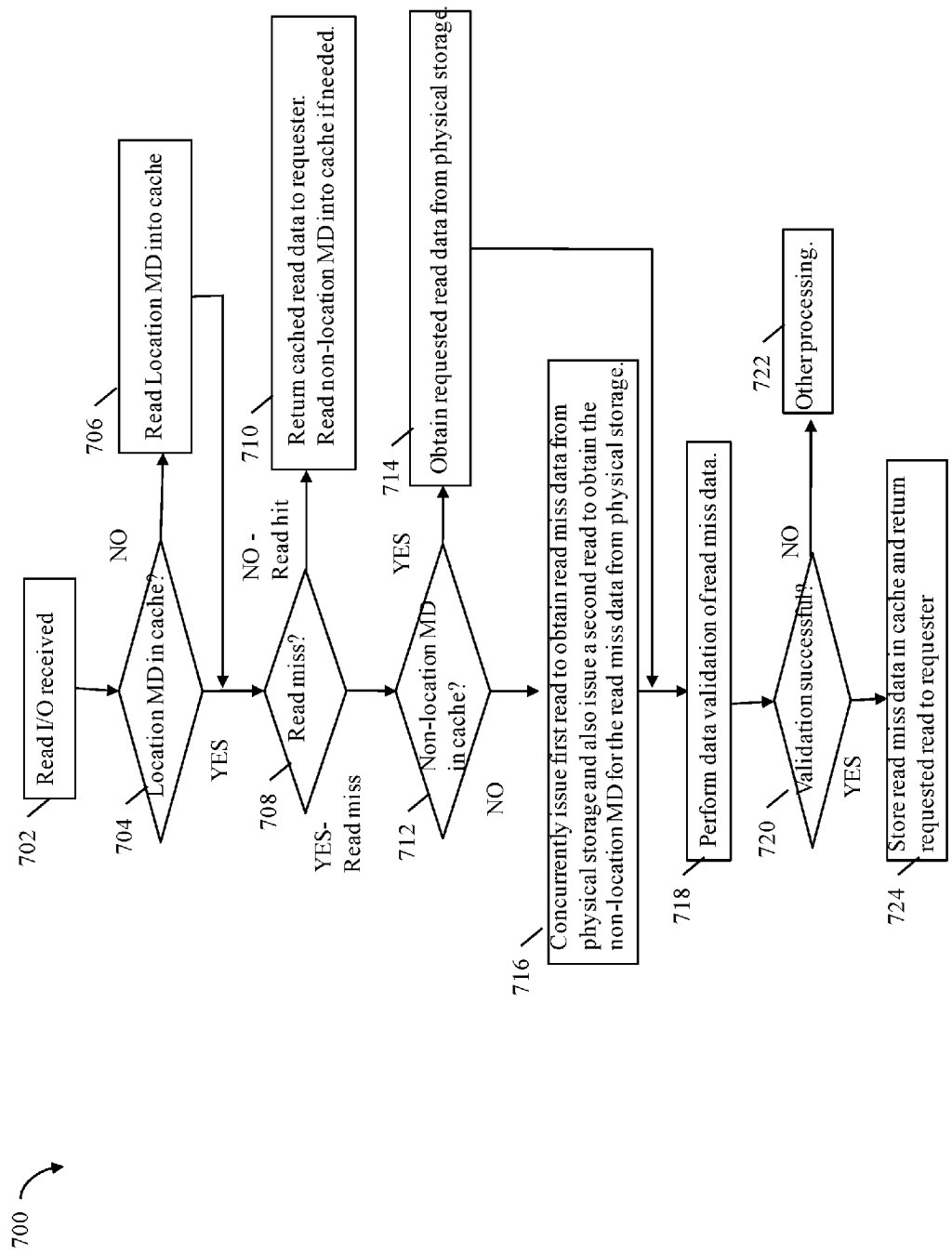

Referring to FIG. 11, shown is a second flowchart of processing steps that may be performed in an embodiment in accordance with techniques herein. The steps of the flowchart 700 summarize processing as described herein and provide further detail in connection with processing such as illustrated in FIG. 10. Generally, steps 702, 704, and 706 are respectively similar to steps 652, 654 and 656 of FIG. 10. Beginning with step 708, additional detail is provided in connection with processing steps for the read operation received. At step 708, a determination is made as to whether the read operation is a read miss. If step 708 evaluates to no meaning the read is a read or cache hit, control proceeds to step 710. At step 710, the cached read data is returned to the requester. Additionally, as part of step 710, the non-location MD may be read from physical storage into cache if needed or otherwise desired.

If step 708 evaluates to yes whereby the read operation is a read miss, control proceeds to step 712. At step 712, a determination is made as to whether the non-location MD for the read miss is currently in cache. If step 712 evaluates to yes, control proceeds to step 714 to obtain the requested read miss data from physical storage. Control proceeds to step 718.

If step 712 evaluates to no whereby there is a read miss and the non-location MD for the read miss is also not in cache, control proceeds to step 716 to concurrently issue the first read to obtain the read miss data and the second read to obtain the non-location MD for the read miss data from physical storage. Steps 716, 718, 720, 722 and 724 are respectively similar to steps 666, 668, 670, 672 and 674 of FIG. 10.

Figure 12:
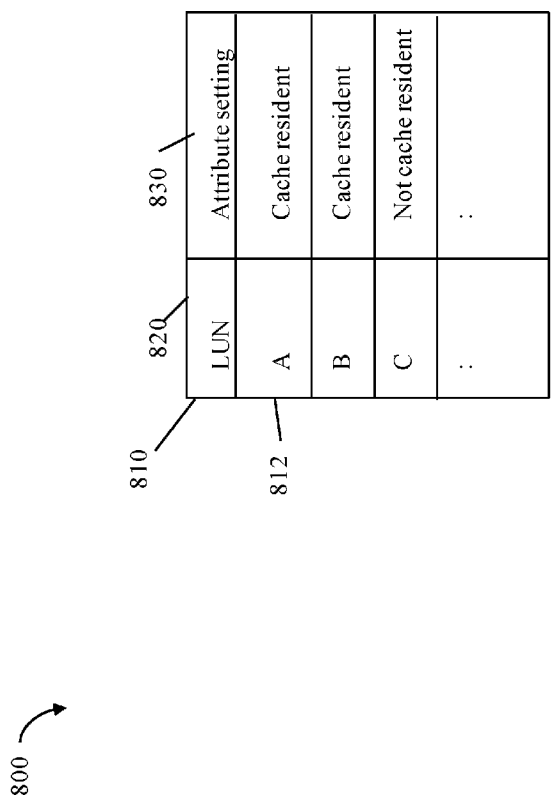
FIG. 12 is an example illustrating attribute settings that may be maintained for logical devices in an embodiment in accordance with techniques herein.

Referring to FIG. 12, shown is an example of attribute settings that may be maintained for logical devices or LUNs in an embodiment in accordance with techniques herein. The example 800 includes a table 810 of attribute settings with a first column 820 of LUNs and a second column 830 of attribute settings for each of the LUNs denoted in column 820. Each row of the table 810 identifies a current attribute setting in 830 for a LUN on 820 of the row. For example, 812*a* indicates that LUN A has an associated attribute setting of cache resident whereby location metadata for each track of LUN A is to remain cache resident once the location metadata is brought into cache. Row 812*b* indicates that LUN B has an associated attribute setting of cache resident whereby location metadata for each track of LUN B is to remain cache resident once the location metadata is brought into cache. Row 812*c* indicates that LUN C has an associated attribute setting of not cache resident whereby location metadata for each track of LUN C may not remain cache resident once the location metadata is brought into cache. Thus, LUN C location metadata may be paged out of cache as additional cache slots or locations are needed by cache management processing for performing I/O operations, and the like.

As described elsewhere herein, an embodiment may dynamically modify the values of the attribute settings in column 830 between a first setting of cache resident (indicating that associated location metadata for any track of the LUN should remain cache resident) and a second setting of not cache resident (indicating that associated location metadata for any track of the LUN is not cache resident and may be paged out of cache). Such modification may generally be performed in an accordance with any one or more suitable criteria in an embodiment. For example, as noted above, the attribute setting for a LUN may be cache resident during defined periods of use or activity where it is expected that I/O operations will be received at the data storage system for the LUN.

As also described herein, the example 800 illustrates specifying one attribute in column 830 for each LUN whereby the setting in 830 may be applied to all location metadata for any track of the LUN. More generally, a single attribute may be associated with a defined group of multiple LUNs and/or may be associated with a portion of a LUN, such as a portion of less than all tracks of the LUN. In this latter case, a single LUN may be partitioned into groups or ranges of tracks of the LUN and a single attribute may be associated with each such defined group or range of tracks of the LUN (e.g., multiple attributes associated with a single LUN).

Figure 13:
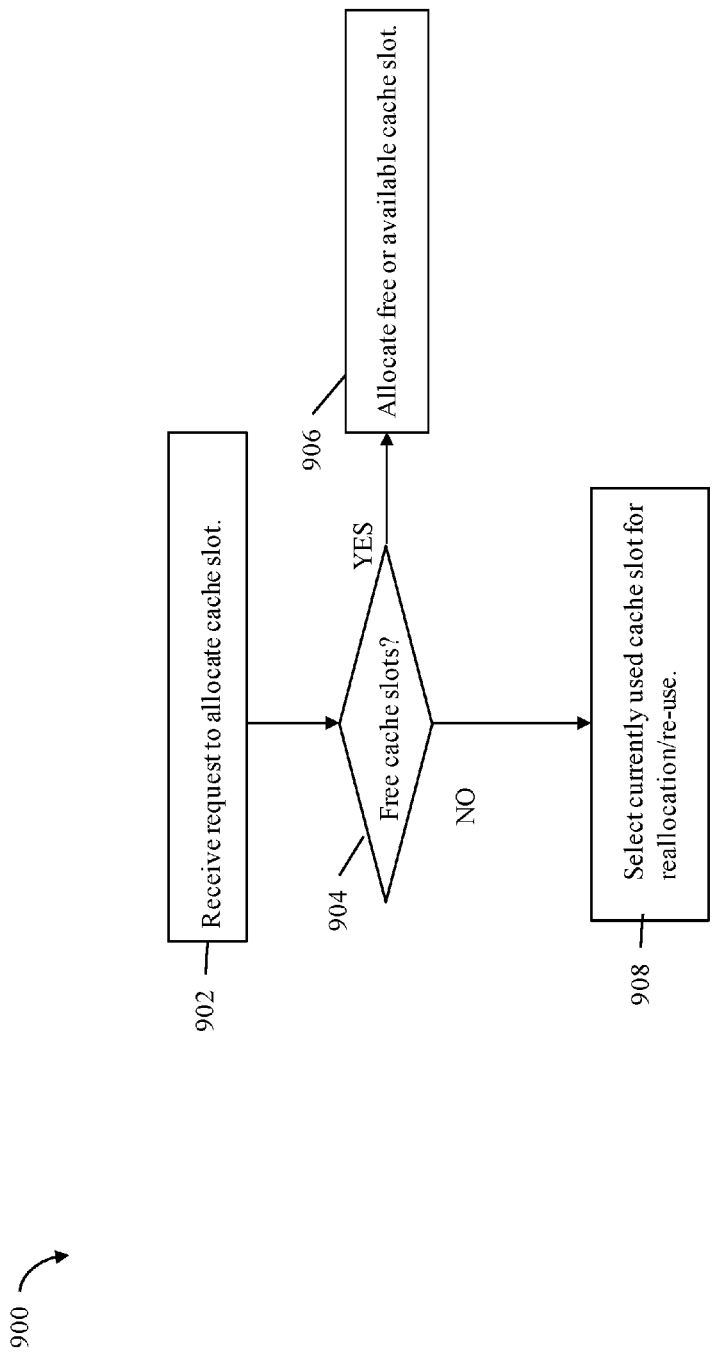

Referring to FIG. 13, shown is a flowchart of processing steps that may be performed in connection with cache management in an embodiment in accordance with techniques herein. Generally, cache management software may perform such processing to maintain the cache. Such processing may include allocating cache slots as needed, for example, such as to store write pending data or write operation data which is later destaged (e.g., written out) to physical storage, to store data read from physical storage, to store location MD, to store non-location MD, and the like.

At step 902, cache management software may receive a request to allocate a cache slot. Some examples of when a cache slot may be requested are noted above. At step 904, a determination is made as to whether there is a free cache slot. A free cache slot may be, for example, a cache slot which is currently not allocated or may not otherwise include valid data, such as valid user data. If step 904 evaluates to yes, control proceeds to step 906 where a free cache slot is allocated. Otherwise, if step 904 evaluates to no, control proceeds to step 908. In step 908, processing may be performed to select a currently used cache slot for reallocation or reuse. Step 908 may include performing any suitable processing such as, for example, writing out to physical storage a cache slot including write pending data whereby the cache slot may then be reused or allocated. Step 908 may include, for example, selecting a cache slot including valid user data which has been least frequently accessed or is expected not to be referenced in the near future. To perform such an assessment in this latter case, one or more heuristics may be used, for example, to track when user data of cache slots was last accessed and select the cache slot which has the oldest or least recent access time. Step 908 may include using criteria, such as the attribute settings of FIG. 12 denoting which location MD for which LUNs is marked as cache resident. For example, step 908 processing may include examining cache slots including location MD. If a cache slot includes location MD for a LUN having an attribute setting of cache resident, the cache slot may not be considered a candidate for selection for reallocation in step 908. However, if the cache slot includes location MD for a LUN having an attribute setting of not cache resident, the cache slot may be considered a candidate for selection for reallocation in step 908. In the case of a "not cache resident" attribute setting associated with location MD for a LUN stored in a cache slot, such location MD may be paged out of cache if selected in step 908. In a similar manner, step 908 may consider a candidate cache slot for selection one that includes non-location MD as described elsewhere herein.

Figure 14:
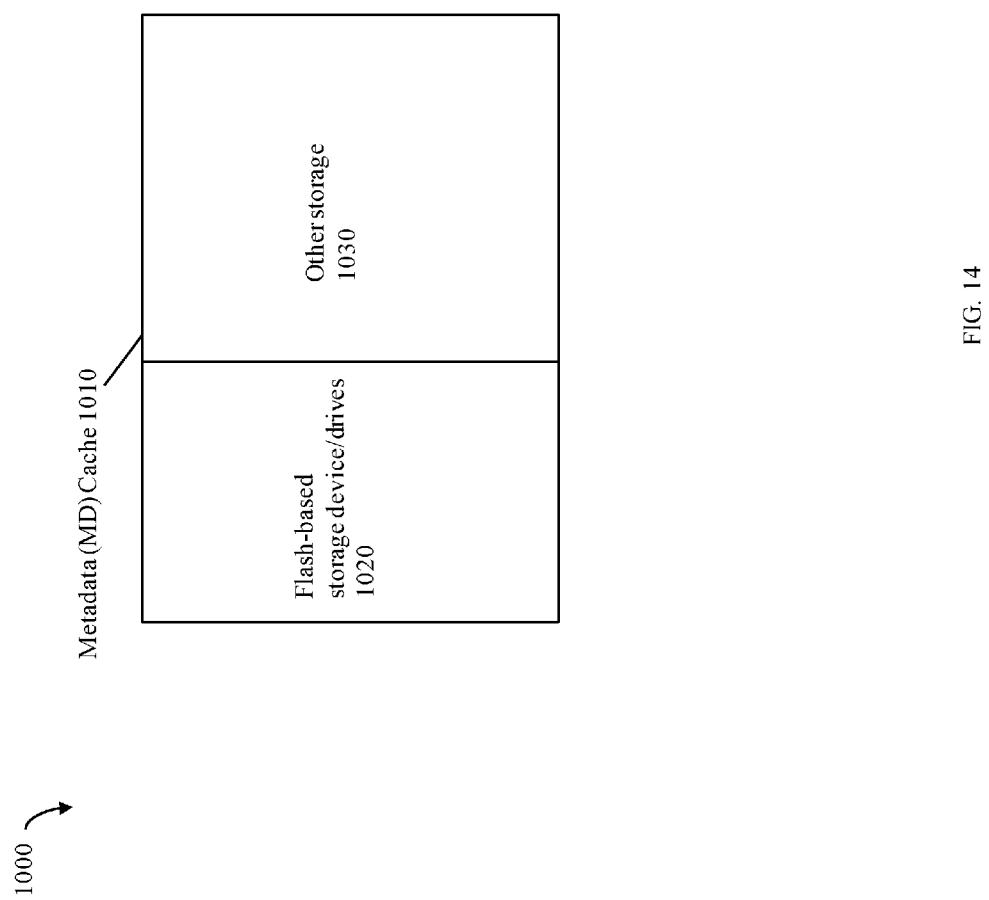
FIG. 14 is an example illustrating a metadata cache that may be used in an embodiment in accordance with techniques herein.

Consistent with discussion above, an embodiment in accordance with techniques herein may use main or global memory, as well as one or more other memories or forms of "fast" storage, for caching purposes, such as for general data caching in connection with I/O operations as well as for caching metadata, such as related to logical devices (e.g., LUNs) as discussed elsewhere herein. Additionally with reference now to FIG. 14, in at least one embodiment in accordance with techniques herein, physical storage used as a metadata (MD) cache 1010 (that caches metadata for logical storage devices as described herein) may include flash memory-based storage devices 1020 and also other types of physical storage or memory 1030 used for caching MD pages. As described below in more detail, in at least one embodiment, different portions of the metadata may be persistently stored in the flash-based storage devices 1020 with remaining portions of the MD stored on other types of physical storage or memory 1030 of the cache. It should be noted that more generally, element 1020 may denote a persistent or non-volatile form of fast storage, and element 1030 may generally denote other types of fast storage or memory used for caching where such other types may include one or more forms of volatile storage or memory. As known in the art, the contents of non-volatile or persistent storage are retained even when the power is cycled off In contrast, volatile storage requires power in order to retain its contents.

An embodiment of a data storage system may use techniques described in more detail below that provide an efficient data structure and data movement strategy to reduce write wear, for example, of flash-based storage used for storing selected MD portions for tracks of a LUN. For example, the size of the data portion moved may be optimized for the particular data storage system configuration and storage layout, such as the particular RAID layout (e.g., number of RAID members, stripe size, RAID-level, and the like) and processing of the associated MD structures may also be optimized to reduce write wear of flash-based storage upon which the MD structures are stored. Furthermore, the MD corresponding to the data portion moved in a single data movement may be stored within the same single flash page. The foregoing and other aspects of techniques herein as may be incorporated into various embodiment are described in more detail below.

With reference again to FIG. 14, the flash-based storage devices or drives 1020 may include one or more different types of flash drives that are of one or more write endurance classifications. Different types of flash drives, such as SLC (single level cell), MLC (multiple level cell) and TLC (triple level cell), have different write endurances. Flash-based media experiences wear out based on the number of writes performed. Within a lifetime or usage period, the amount of writes that each type of flash, such as MLC or SLC, may be expected to successfully sustain varies. For example, SLC stores one bit of information or data per cell and may be the simplest of all flash types. Due to having only one bit per cell, it may therefore have the longest lasting of the flash types in an embodiment in accordance with techniques herein. In contrast, for example, with MLC and TLC, multiple bits of information are stored per cell and wear rate during write operations is greater than with SLC. Thus, during a usage or lifetime period, an SLC device is expected to be able to have a larger number of allowable writes than an MLC device. In this manner, the SLC device may be characterized as an example of a type of flash having a higher write endurance than another type of flash media such as the MLC device.

A flash memory-based storage device may have an expected lifetime (e.g., as measured in an amount of actual elapsed time such as a number of years, months, and/or days) based on a number of guaranteed write cycles, or program cycles, and a rate or frequency at which the writes are performed. To guarantee approximately the same lifetime of use (in terms of wall clock time) for different types of flash-based physical storage devices, such as SLC and MLC, a different number of allowable writes per day may be specified for each type of flash-based physical storage device (e.g., SLC, MLC, TLC) based on the write endurance variation of each type. In other words, different types of flash technology also have different wear levels where such wear occurs as a result of the writes (e.g., write cycles) performed.

Flash drives may have write endurance expressed in full drive writes per day based an expected lifetime of usage. For example, a 200 GB drive having N full drive writes per day (to last for a specified lifetime such as 5 years) may write 200*N GB per day. Thus, the writes/day may be characterized as an average amount of allowable writes/day in order to have the physical device operate for the specified lifetime.

It should be noted that although techniques described in following paragraphs may be illustrated with respect to flash memory-based storage devices as the form of persistent storage for 1020, more generally, techniques herein may be applied in connection with any storage media and technology subject to write wear that has an expected lifetime or usage that is a function of devices wear based on the number of writes or program erasures made with respect to that physical device. For example, techniques herein may also be used in connection with phase-change memory (PCM) devices. PCM is also known in the art as PCME, PRAM, PCRAM, Ovonic Unified Memory, Chalcogenide RAM and C-RAM and is a type of non-volatile random-access memory. Generally, such a storage device, such as a flash memory-based storage device, that has an expected lifetime or usage that is a function of the number of writes or program erasures made with respect to that physical device may be characterized as having a write capacity denoting a total number of writes expected that the physical device can sustain during its operable lifetime. A remaining write capacity may denote an amount, portion or percentage of the such expected number of total writes remaining that have not yet been consumed whereby the remaining write capacity may decrease each time a write is made to the physical storage device. The remaining write capacity of a physical storage device (also referred to as % lifetime remaining) may be expressed, for example, as a percentage with respect to the write capacity for the physical storage device.

The data storage environment of the data storage system used in connection with techniques herein may define multiple storage tiers in which each tier includes physical devices or drives of varying technologies. The physical devices of a data storage system, such as a data storage array, may be used to store data for multiple applications. An embodiment in accordance with techniques herein may have one or more defined storage tiers. Each tier may generally include physical storage devices or drives having one or more attributes associated with a definition for that tier. For example, one embodiment may provide a tier definition based on a set of one or more attributes. The attributes may include any one or more of a storage type or storage technology, a type of data protection, device performance characteristic(s), storage capacity, and the like. The storage type or technology may specify whether a physical storage device is an SSD (solid state drive such as a flash drive), a particular type of SSD drive (such using a particular type of flash (e.g., SLC, MLC) or a form of RAM), a type of magnetic rotating disk drive or other non-SSD drive (such as an FC disk drive, a SATA (Serial Advanced Technology Attachment) drive, SAS, NL-SAS), and the like. Data protection may specify a type or level of data storage protection such, for example, as a particular RAID (redundant array of independent disks) level (e.g., RAID1, RAID-5 3+1, RAID5 7+1, and the like). Performance characteristics may relate to different performance aspects of the physical storage devices of a particular type or technology. For example, there may be multiple types of FC disk drives based on the RPM characteristics of the FC disk drives (e.g., 10K RPM FC drives and 15K RPM FC drives) and FC disk drives having different RPM characteristics may be included in different storage tiers. Storage capacity may specify the amount of data, such as in bytes, that may be stored on the drives. An embodiment may allow a user to define one or more such storage tiers. For example, an embodiment in accordance with techniques herein may define two storage tiers including a first tier of all SSD drives and a second tier of all non-SSD drives. Thus, the storage tiers in an embodiment may have a relative performance ranking. For example, a storage system may include 3 storage tiers—a first storage tier of flash storage drives having a highest performance ranking, a second storage tier of 15K RPM drives having a second or middle performance ranking and a third tier of 10K RPM drives having the lowest or third performance ranking of the foregoing 3 tiers.

A RAID group and various RAID configurations are known in the art. A RAID group configuration uses multiple physical devices to provide a combination of fault tolerance and/or improved performance for data storage devices. For example, a RAID-5 group includes multiple PDs and provides protection from a single PD failure with block level striping and distributed parity information, and RAID-6 provides protection from two PDS of the RAID group failing with two sets of distributed parity and block level striping. The particular RAID levels described herein are merely exemplary and not a limitation of the techniques described herein.

In an embodiment having multiple storage tiers, techniques may be performed for automated storage tiering and data movement between different storage tiers, such as may be performed by a data storage optimizer, to improve data storage system performance. For example, the Fully Automated Storage Tiering (FAST) product produced by EMC Corporation of Hopkinton, Mass., provides such automated movement of data between different storage tiers to optimize use of the different storage tiers including the ability to easily create and apply tiering policies (e.g., allocation policies, data movement policies including promotion and demotion thresholds, and the like) to transparently automate the control, placement, and movement of data within a storage system based on business needs. A data storage optimizer, multi-tiered storage and automated tiering is described, for example, in U.S. Pat. No. 8,583,838, Techniques for Statistics Collection in Connection with Data Storage Performance, Nov. 12, 2013, which is incorporated by reference herein. In such a multi-tiered storage environment, each of the different storage tiers may include different PDs having different performance characteristics. For example, a multi-tiered storage system may include a first tier of rotating disk drives and a second tier of flash memory-based PDs. In such an environment where data that is promoted or placed into the second tier, techniques may be used to select a particular one PD of the second tier upon which to store the data. For example, in at least one embodiment, the data storage optimizer may perform data movements to locate data portions having the highest/higher I/O workloads on the highest/higher performance tier, such as flash drives of a flash tier of storage. As the I/O workloads directed to different data portions changes over time, the data storage optimizer may automatically relocate such data portions among the different storage tiers based on the different workloads at each point in time. For example, an embodiment may perform data movements at a sub-LUN level of granularity where at a first point in time, a data portion has a high workload and is located in the flash tier. At a second later point in time, the data portion becomes "cold" with a very low or reduced I/O workload and may be demoted from the flash tier to a lower performance tier (e.g., the data portion may be moved to a rotating disk drive tier). In a similar manner, a second data portion may have a low I/O workload and may be "cold" at the first point in time and therefore placed on a rotating disk drive tier. At the second point in time, the second data portion becomes "hot" with a high I/O workload and may be promoted to the flash tier (e.g, the second data portion may be moved from the rotating disk drive tier to the flash tier). Generally, data demotion refers to relocating a data portion from a source tier to a target tier that has a lower performance ranking than the source tier. Data promotion refers to relocating a data portion from a source tier to a target tier that has a higher performance ranking that the source tier.

Techniques herein may be used in an embodiment having thin or virtually provisioned logical devices. A thin device is a type of logical device where units of storage are progressively allocated on an as-needed basis. Typically, the base units of storage are provisioned from multiple sets of PDs organized as RAID groups, where these groups are partitioned into small portions sometimes referred to as slices. There is a mapping provided to relate the logical address in a thin device to the particular slice of provisioned storage. In a system using thin provisioning, the thin devices may appear to a host coupled to a data storage array as one or more logical volumes (logical devices) containing contiguous blocks of data storage. A thin device may be virtually provisioned in terms of its allocated physical storage where physical storage for a thin device (presented to a host as having a particular capacity) is allocated as needed rather than allocate physical storage for the entire thin device capacity upon creation of the thin device. As such, a thin device presented to the host as having a capacity with a corresponding LBA (logical block address) range may have portions of the LBA range for which storage is not allocated. In some embodiments, storage associated with a particular subrange of the logical address space of a thin device (where the subrange may be the size of a slice or chunk allocation unit) may be initially allocated in response to the first time there is write to the logical address subrange. Thin devices and thin provisioning are described in more detail in U.S. patent application Ser. No. 11/726,831, filed Mar. 23, 2007 (U.S. Patent App. Pub. No. 2009/0070541 A1), AUTOMATED INFORMATION LIFE-CYCLE MANAGEMENT WITH THIN PROVISIONING, Yochai, EMS-147US, and U.S. Pat. No. 7,949,637, Issued May 24, 2011, Storage Management for Fine Grained Tiered Storage with Thin Provisioning, to Burke, both of which are incorporated by reference herein.

An embodiment in accordance with techniques herein may provide for logical devices that are thin or virtually provisioned devices along with thick logical devices. A thick device may be characterized as a regular logical device presented as having a particular storage capacity where physical storage is provisioned (allocated or bound) for the entire storage capacity when the thick device is configured.

Figure 15:
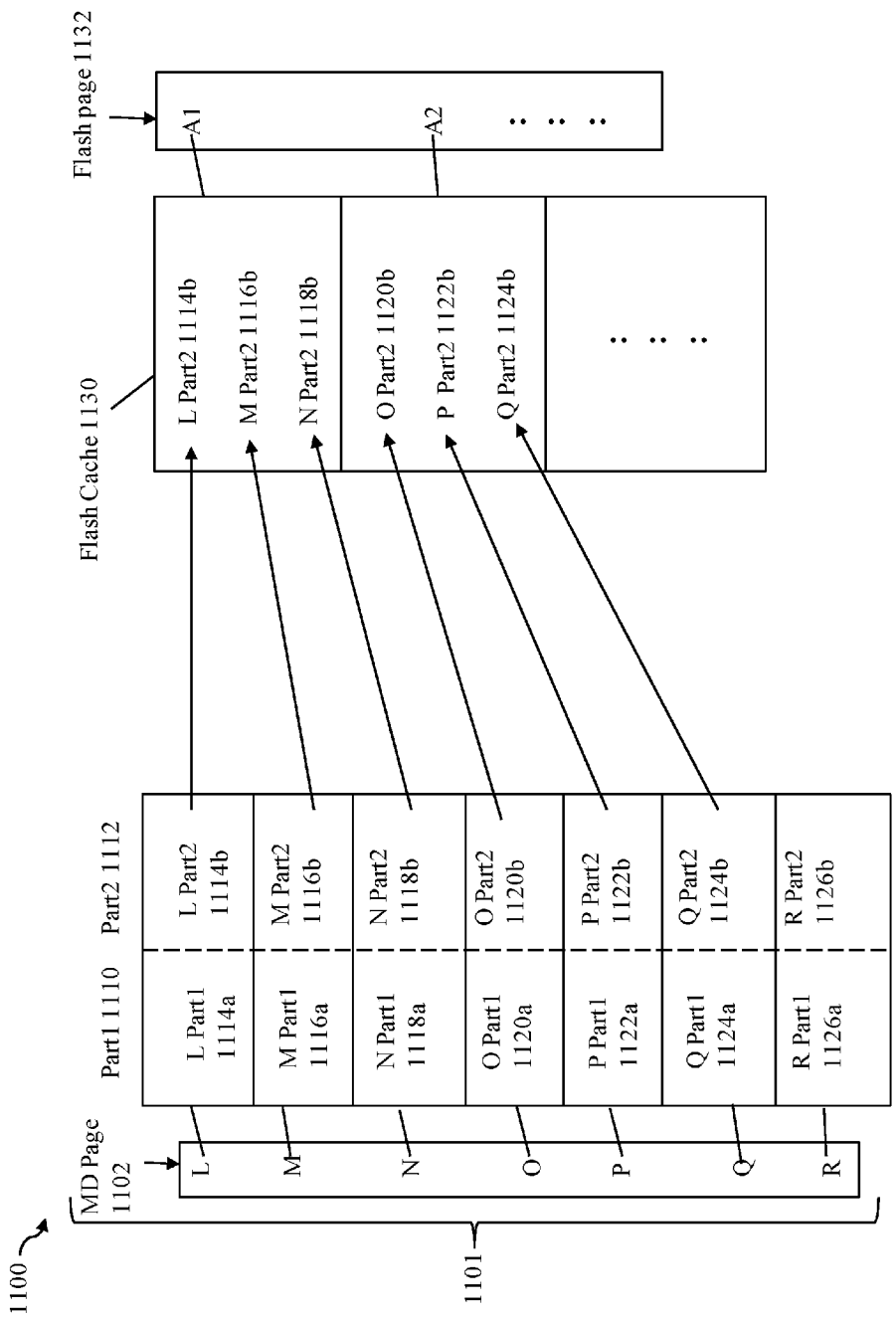
FIG. 15 is an example illustrating in additional detail a layout of the flash cache that may be used in an embodiment in accordance with techniques herein.

Referring to FIG. 15, shown is an example 1100 illustrating MD for a logical device, such as a LUN, as may be used in an embodiment in accordance with techniques herein. It should be noted that MD is described elsewhere herein such as with reference back to FIG. 7 where the MD may be generally partitioned into multiple categories and where location information or location MD is one such category or type of MD that may be stored in a MD cache. Even more generally, MD that is maintained for each track (e.g., data portion or storage unit) of the LUN and stored in the MD cache may be partitioned into two parts—the first part/part 1 includes the MD portions for each track which are stored in the MD cache 1010 but on other storage 1030 (e.g., fast volatile memory) rather than being stored persistently in flash-based storage 1020, and the second part/part 2 includes the MD portions which are stored in the MD cache 1010 persistently on flash-based storage 1020. In at least one embodiment the second part/part 2 1112 of the MD stored persistently on flash-based storage 1020 may include the location MD (e.g., location information indicating mappings between logical LUN addresses and physical storage locations) and may optionally include other pieces of MD that may vary with embodiment. For purposes of simplification in illustration, following examples may refer to part 2 MD 1112 that only includes location MD. However, as will be appreciated by those skilled in the art, the part 2 MD portions for the tracks stored persistently on flash-based storage 1020 may include other MD information used in connection with servicing I/O operations.

In the example 1100, element 1101 may denote a table of MD for the LUN that may be stored in the MD cache. Consistent with other discussion herein, a MD cache page or MD page may refer to the MD chunk or unit that may be paged in and out of the MD cache. For example, in one embodiment, a single MD page may be 4K bytes in size and may include MD for 42 tracks of a LUN. With reference to table 1101, column 1102 denotes the MD page id associated with each MD page including MD information for a different 42 tracks of the LUN. For example, MD page L includes MD for tracks 1-42 of LUN X and MD page M may include MD for the next sequential set of tracks 43-84, and so on. Thus, element 1101 denotes a logical representation of MD for the LUN X as may be stored in the MD cache. Additionally, as noted above, each MD page may be partitioned into two parts—a first part/part 1 1110 and a second part/part 2 1112. Part 2 1112 (e.g., 1114*b*, 1116*b*, 1118*b*, 1120*b*, 1122*b*, 1124*b*, 1126*b*) of each MD page 1102 may include Part 2 MD for the 42 tracks associated with that page. The part 2 MD 1112 (e.g., 1114*b*, 1116*b*, 1118*b*, 1120*b*, 1122*b*, 1124*b*, 1126*b*) of all MD pages 1102 may be stored persistently in flash-based storage 1020 of the MD cache and all remaining MD of each MD page included in part 1 1110 (e.g., 1114*a*, 1116*a*, 1118*a*, 1120*a*, 1122*a*, 1124*a* and 1126*a*) may be stored on other storage 1030 of the MD cache. Further, in at least one embodiment, Part2 1112 of each MD page includes the location MD for the 42 tracks associated with that particular MD page that is cached. For example, L Part2 1114*b* includes the location MD for tracks 1-42 of LUN X and L Part1 1114*a* includes all other MD for tracks 1-42 of LUN X, M Part2 1116*b* includes the location MD for tracks 43-84 of LUN X and M Part1 1116*a* includes all other MD for tracks 43-84 of LUN X, and so on, for each of the MD pages N, O, P, Q and R.

The flash cache 1130 may denote the flash-based storage devices 1020 of the MD cache 1010 used for storing the Part2 MD portions 1112 of each cached MD page of 1101. Data that is written to the flash cache 1130 may have a size granularity or unit such as 4K bytes whereby each write performed to store data in the flash cache 1130 (and also each read performed to read data from the flash cache 1130) may have a size of 4K bytes. The foregoing size granularity denoting the size of chunks of data written to (and also read from) the flash cache 1130 may be referred to herein as a flash page size. Thus, data stored in the flash cache 1130 with a single write may be referred to as stored in the same flash page or chunk of flash memory updated as a single unit with the single write. For example, column 1132 denotes the flash page identifiers whereby A1 refers to one flash page storing 4K bytes of data and A2 refers to another second flash page storing another 4K bytes of data. In this example, assume for purposes of illustration that the part2 MD 1112 from 3 MD pages fits evenly into a single 4K byte flash page. In this case, flash page A1 includes the part2 MD for MD pages L, M, and N as illustrated by elements 1114*b*, 1116*b* and 1118*b*. Flash page A2 includes the part2 MD for MD pages O, P and Q as illustrated by elements 1120*b*, 1122*b* and 1124*b*. In a similar manner, subsequent part 2 MD portions for other MD pages 1102 of table 1101 may be stored in other flash pages of the flash cache 1130. Thus, element 1130 may denote part of the MD cache layout for storing some of the cached MD (e.g., the part 2 MD portions 1112) logically represented by 1101.

In connection with updating any portion of a single flash page of the flash cache 1130 in this example, an entire 4K byte flash page must be written out to the flash cache 1130 in a single write operation. Generally, performing such a write for only a portion of the entire flash page may include reading the current version of the data of entire flash page from the flash cache 1130 where such data may be stored in a buffer, updating or modifying the portion of the current version of the data as stored in the buffer, and then writing updated version of the data of the entire flash page 1130 from the buffer to the flash cache 1130. The foregoing sequence may be referred to as a read-modify-write sequence of steps performed to update a flash page of the flash cache 1132.

To further illustrate, as described herein, an embodiment of a data storage system may utilize a data storage optimizer that performs data movements to relocate data portions between different storage tiers as the I/O workloads directed to the different data portions may vary over time. The data storage optimizer may perform such data movements to move data portions each having a relatively small size, such as a single track or a small number of tracks depending on the particular data movement size granularity used in an embodiment. Furthermore, the data movements each moving a different data portion may be done at different points in time possibly resulting in multiple updates to location MD of a single flash page. For example, assume data movements are performed each relocating a single track. Thus, at a point in time, the location MD for a single track having its MD stored in a MD page needs to be updated.

Figure 16:
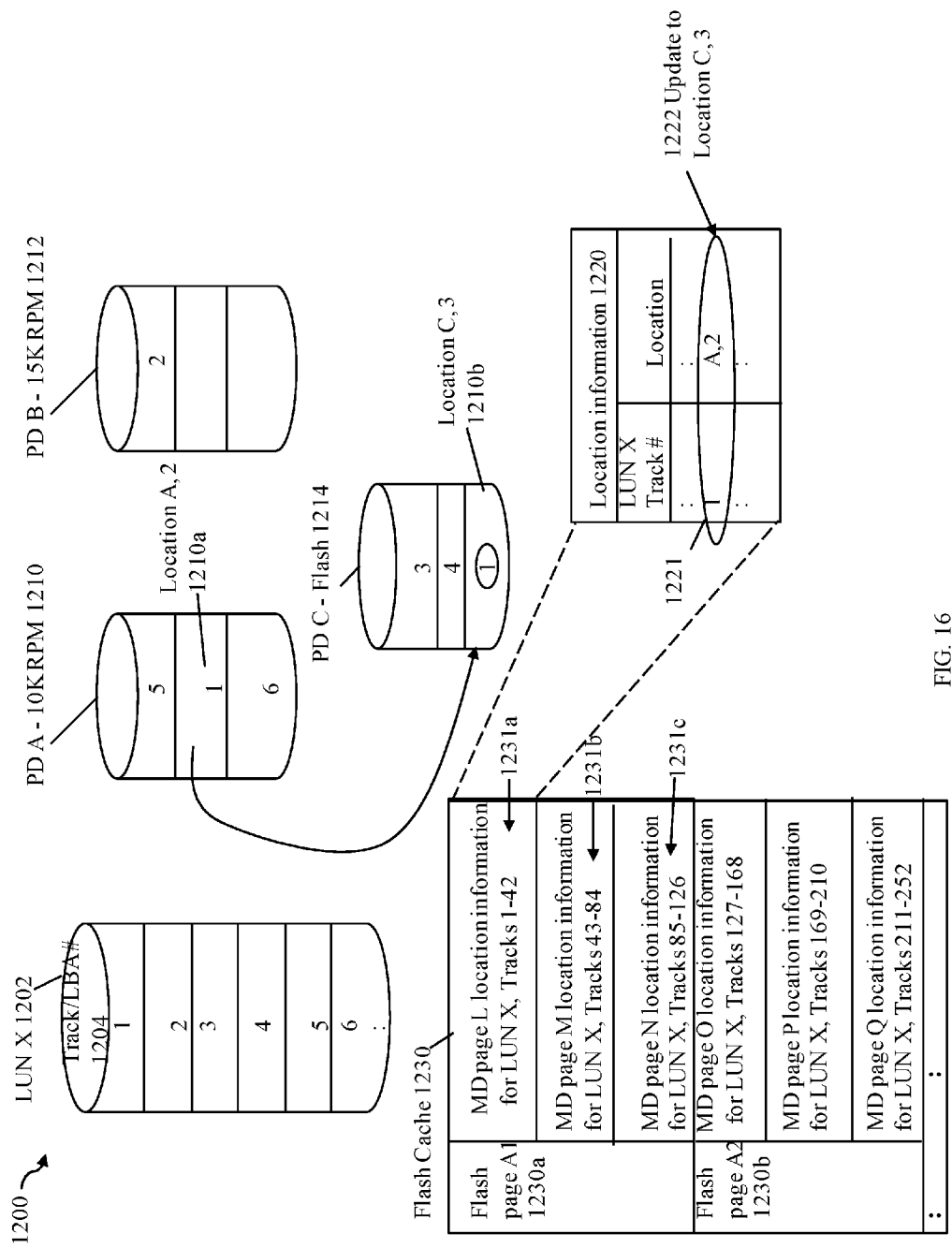
FIG. 16 is an example illustrating metadata in connection with performing a data movement in an embodiment in accordance with techniques herein.

Reference is now made to FIG. 16 to further illustrate updating of location MD such as may be performed in connection with a data movement that relocates a single track of data. The example 1200 includes LUN X 1202 having tracks numbered as denoted by 1204. The example 1200 also includes PDs for 3 storage tiers—a first or highest performance first storage tier of flash drives, a second or mid-performance storage tier of 15K RPM drives and a third or lowest performance storage tier of 10K RPM drives. PD A 1210 is a 10 RPM drive of the third tier, PD B 1212 is a 15K RPM drive of the second tier, and PD C 1214 is a flash drive of the first or highest performance tier. At a first point in time, based on current I/O workloads directed to the different tracks of LUN X 1202, data for tracks 1-6 of LUN X may be stored on various ones of the PDs 1210, 1212 and 1214 as illustrated where tracks 1, 5 and 6 are stored on PD A, track 2 is stored on PD B, and tracks 3 and 4 are stored on PD C. Although not illustrated, other tracks of LUN X 1202 may be similarly stored on PDs of the different storage tiers.

The flash cache 1230 includes the part 2 MD portions of the cached MD pages as described above, such as in connection with FIG. 15. In particular, the flash page A1 1230*a* includes location MD for MD pages L, M and N (as described in connection with FIG. 15); and flash page A2 1230*b* includes location MD for MD pages O, P and Q (as described in connection with FIG. 15). Element 1220 illustrates in more detail the location MD for MD page L for tracks 1-42 of LUN X where element 1221 denotes the location information for track 1 of LUN X as "A, 2" denoting the LUN X, track 1 has its data stored at physical storage location or offset 2 on PD A at a first point in time. At this first point in time, the I/O workload for track 1 of LUN X is low and therefore data for track 1 is stored on the lowest performance tier on the 10K RPM PD A. At a second point in time, LUN X, track 1 has an increase in I/O workload and the data storage optimizer may schedule and perform a data movement of the data stored at LUN X, track 1 to the first or highest performance flash tier. More specifically, the data movement may move LUN X, track 1 from PD A, location 2 1210*a* to PD C, location 3 1210*b*. Accordingly, the location MD 1221 for LUN X track 1 is updated 1222 in connection with performing this data movement.

In this example just described in connection with FIG. 16, only the location MD for track 1 of LUN X needs to updated where LUN X, track 1 has its MD stored in MD page L. The location MD for LUN X, track 1 is stored in flash page A1 1230*a* of the flash cache 1230. In this case, the data for entire flash page A1 (e.g., location MD for MD pages L, M and N as denoted respectively by data elements 1231*a-c*) may be read from the flash cache 1130 and stored in a buffer. The location MD 1221 for track 1 of LUN X in MD page L may be updated and then the updated buffer contents for the entire flash page A1 1230*a* may be written out to the flash cache 1230. Thus, although only a single track's location MD needs updating, write wear occurs with respect to the entire flash page A1. Depending on the particular reason or operation for performing a data movement requiring updating of a track's location MD, the number of tracks having their location MD updated at any point in time may vary. For example, as described herein, an embodiment of a data storage system may utilize a data storage optimizer that performs data movements to relocate data portions between different storage tiers as the I/O workloads directed to the different data portions may vary over time. The data storage optimizer may perform such data movements to move data portions each having a relatively small size, such as a single track or a relatively small number of tracks depending on the particular data movement size granularity used in an embodiment. Furthermore, the data movements each moving a different data portion may be done at different points in time possibly resulting in multiple updates to location MD of a single flash page. For example, assume data movements are performed each relocating a single track. As a worst case scenario, 42 data movements may be performed each at a different point in time where the 42 data movements may move tracks 1-42 of LUN X. Thus, the location MD stored in 1230*a* for tracks 1-42 of LUN X is updated 42 separate times resulting in 42 writes of the same flash page A1 1230*a*. Each of the 42 writes only updates the location MD for a single track. Such additional writes increases the write wear incurred by the flash cache 1230.

What will now be described are techniques that may be used in an embodiment to reduce the write wear to the flash drives used in the MD cache to store MD information, such as the location MD. Generally, techniques herein provide for locating location MD, or more generally part 2 MD, of larger data chunks in the same flash page so that the reading and writing of the MD for a single data movement may be performed in a single flash page write rather than writing multiple such flash pages. In one embodiment, the larger data chunks may each correspond to data movements of multiple tracks of data rather than, for example, move each single track at a different point in time (whereby the part 2 MD is accordingly updated with movement of each track).

As discussed above, a flash page may include part 2 MD for multiple tracks, or more generally, multiple MD objects each including MD for a different entity (e.g., MD object for each storage entity denoting a unit of storage such as a track). Rather than performing single data movements each at a different time and each for a small data chunk (e.g., single track), at least one embodiment in accordance with techniques herein may combine data movements of multiple tracks into a single data movement where the part 2 MD for such multiple tracks are located in the same flash page. In this manner, the part 2 MD for all moved multiple tracks may be updated and then written out to flash in a single write of the same flash page to flash cache. The size of the moved chunk or data portion may also be referred to as the data movement granularity size. The data movement granularity size may be selected for optimization in connection with one or more aspects related to a particular data storage system configuration. For example, the data movement granularity size may be based one or more values including M denoting the number of tracks, or more generally, objects having their MD stored in a single MD page where at least a portion of the MD for each such object (e.g., such as a track) is stored in the flash cache. Additionally, in this particular embodiment, M is 42 and also denotes an optimal size (number of tracks) of the data portion moved where such movement size is optimized for the particular data storage system configuration and storage layout, such as the particular RAID layout (e.g., number of RAID members, stripe size, RAID-level, and the like). It should be noted that 42 tracks may be the optimal data movement size granularity selected to optimize RAID efficiency for one particular data storage system and supported RAID layout(s). Thus, the optimal size of M may vary with embodiment.

In at least one embodiment in accordance with techniques herein, the data movement granularity M may be 42 tracks to optimize the data movement chunk size. Processing for different data storage services and operations, such as the data storage optimizer, may be performed to move a single data portion at a point in time where the single data portion has a size=M. In such an embodiment, M may denote the number of tracks, or MD objects, in a single MD cache page having at least a portion of their MD (e.g., the part 2 MD of each of the 42 tracks or MD objects) stored in the flash cache. The part2 MD for the 42 tracks of the data portion moved may be stored in the same flash page of the flash cache 1230 in efforts to reduce flash write wear and optimize processing performed in connection with MD stored in the flash cache 1230. Storing the part 2 MD for each chunk or data portion of 42 tracks that may be moved as a single unit in a single flash page allows for reading such MD from, and writing such MD to, the flash cache 1230 in a single operation.

With reference back to FIG. 16, rather than perform data movements each of a single track, an embodiment of the data storage optimizer in accordance with techniques herein may move data portions each of which is a size of M, which in this example denotes a size of 42 tracks. Using such a data movement size of M optimizes performing the data movement for the particular RAID layout and other aspects of the physical storage arrangement/configuration. Additionally, each data portion of size M that may be a data movement candidate with its associated Part2 MD stored in the same flash page improves processing and also reduces flash wear in several respects. First, all MD for the single data movement of 42 tracks may be read and written in a single operation of a single flash page. Second, flash wear is also reduced in that the single write is performed to update part 2 MD for 42 tracks rather than only a single track. For example, using a data movement size of M=42 tracks for moving tracks 1-42 of LUN X as a single data portion allows for updating all location information 1220 for the 42 tracks in a single write operation.

More generally, an embodiment in accordance with techniques herein may select a data movement size that is an integer I multiple of M, I>0 (e.g., data movement size of 42 tracks, 84 tracks, and the like). In such an embodiment, selection of the data movement size may take into account N denoting how many MD pages have their associated MD completely stored in a single flash page. For example, with reference to the flash cache 1230, each flash page includes part 2 MD for 3 cached MD pages (e.g., flash page A1 includes MD information for cached MD pages L, M and N). In at least one embodiment in accordance with techniques herein, the data movement size may be determined in accordance with one or more values including N and M. The foregoing may be expressed as in EQUATION 1 below for determining the data movement size (DM size):

$$\text{DM size} = N*M*I \qquad \text{EQUATION 1}$$

wherein N, M and I are as described above and wherein "N*M*I" denotes a mathematical product of N, M and I. Additionally, the DM size may be bounded by the amount of MD stored in a single flash page. For example, the location information or location MD (e.g., part 2 MD) for a single data movement may be included in a single same flash page. To further illustrate with reference to FIG. 16, an embodiment in accordance with techniques herein may select a data movement size that is an integer multiple of 42 tracks (e.g., 42 tracks, 84 tracks, 126 tracks), wherein all location information (part 2 MD) for such tracks moved in a single data movement may be stored in a single flash page providing for further reduction of flash write wear. Thus, such an embodiment provides for selecting a data movement size that takes into consideration the MD page layout (e.g., number of MD objects M. such as tracks, having MD stored in each MD page) in combination with the MD cache layout, such as the flash cache layout. Furthermore, an embodiment may optionally have an upper bound limit on the size of a single data movement whereby all location MD (e.g., part 2 MD) for the data portion moved is included in a single flash page. For example, with reference to FIG. 16, an embodiment may have an upper bound on the data movement size of 126 tracks whereby all location MD (part 2 MD) for the 126 track portion moved are included in a single flash page. With reference back to FIGS. 15 and 16, each flash page of the flash cache 1130, 1230 includes a concatenated sequence of 3 part 2 MD portions for 3 MD pages. The 3 MD pages include MD for a sequence of consecutive or logically contiguous locations of the LUN X, such as for 126 contiguous tracks (e.g., tracks 1-126 in flash page A1 1230*a*, tracks 127-252 in flash page A2 1230*b*).

It should be noted that data movement size selection techniques described herein may be used in connection with performing data movements, such as by a data storage optimizer as illustrated in connection with FIG. 16. More generally, such techniques described herein may be used in connection with the data movement size used in connection with any data storage system service, facility, operation, functionality, and the like, performed in a data storage system. For example, as discussed above, the data movement size may denote the size of a single data portion moved between different storage tiers. With a replication service or facility (local and/or remote), data may be transmitted or moved for replication in chunks each having a size equal to the data movement size. For example, in connection with RDF, data may be transmitted from the local to the remote data storage system in chunks each the size of the data movement size. When creating a clone or complete physical copy, the data movement size may denote the size of each chunk of data copies from the original to the replica or physical copy. With snapshots, the data movement size may denote the size for which changes are tracked and moved as changes to an original or data source are made. It should be noted data storage services or facilities including RDF or remote data facility, clones and snapshots are generally described above and also known in the art.

For simplicity, the foregoing illustrate examples where the number of MD pages having associated MD portions (e.g., part 2 MD or location information) stored in a single flash page falls on a boundary alignment of a single flash page. For example, the location MD or part 2 MD for 3 MD pages fits evenly into a single flash page. In some embodiment, there may not be such a boundary alignment. In such embodiments, different approaches may be used to adapt the foregoing techniques for selecting a data movement size.

Figure 17:
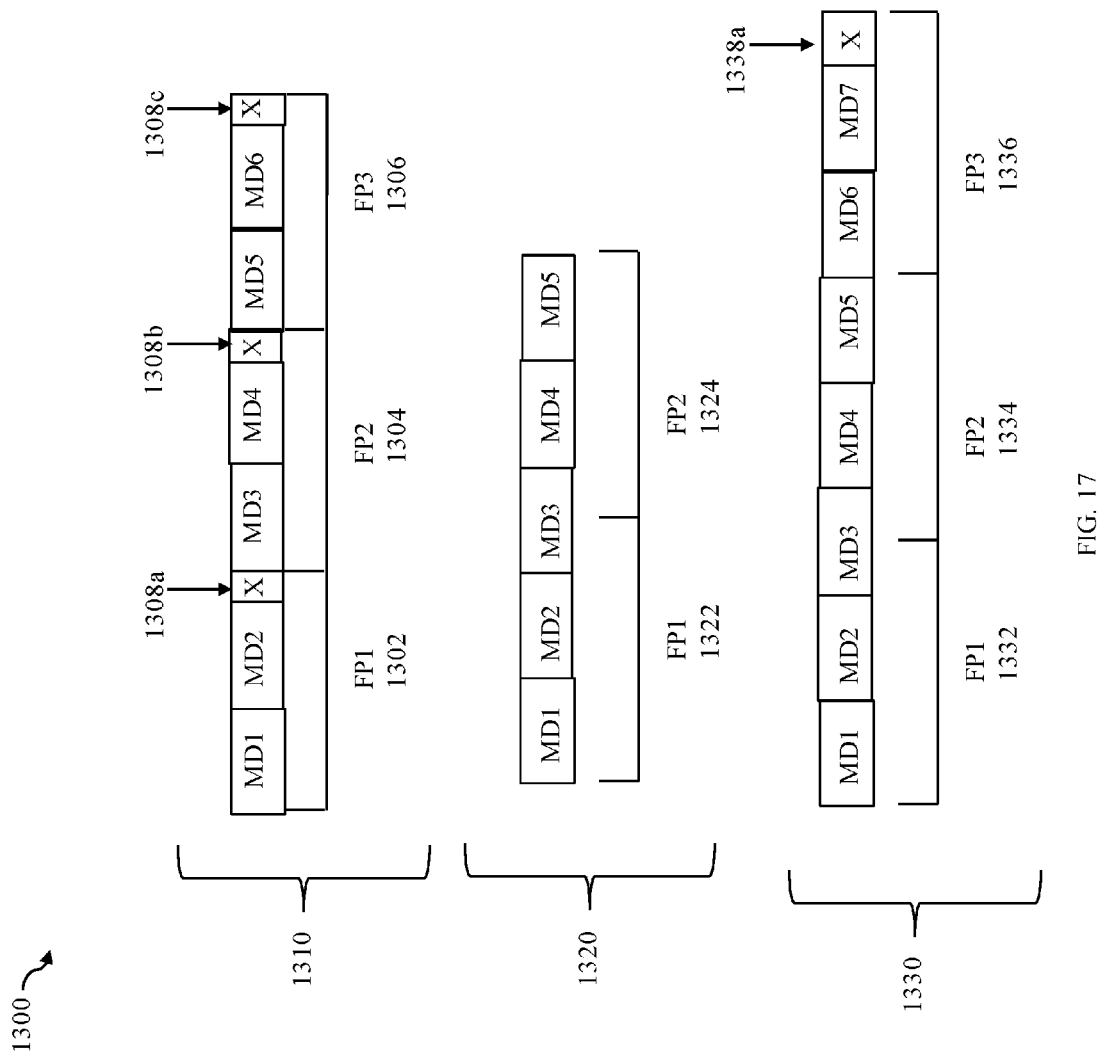
FIG. 17 is an example illustrating different metadata layouts of the flash cache, and thus associated buffers, that may be used in an embodiment in accordance with techniques herein.

Referring to FIG. 17, shown are examples 1300 of different flash cache layouts that may be used in an embodiment in accordance with techniques herein where the MD portions for each MD page stored in the flash cache do not align on each single flash page boundary. In each of the examples of 1300, each MD page may store part 2 MD, such as location MD, for 42 tracks or MD objects as described above.

In the example 1310, MD1, MD2, MD3, MD4, MD5 and MD6 each denote location MD or part 2 MD of 6 different MD pages stored in the flash cache. FP1 1302, FP2 1304 and FP3 1306 denote 3 flash pages of the flash cache. In the example 1310, MD for 2 MD pages fits completely within a single flash page with an additional remaining portion X. In this arrangement of 1310, each flash page may be partially filled to only include MD portions for complete MD pages with any remaining portion X of the flash page being unused (e.g., does not include any MD). Elements 1308*a-c* denote such unused remaining portions X of flash pages 1302, 1304 and 1306. In such an embodiment, the DM size as expressed using EQUATION 1 may be used as described above to select a DM size such as 42 tracks or 84 tracks. It should be noted that in such an embodiment using 1310, it may be that the remaining portions X 1308*a-c* of the flash pages are minimal and thus may remain unused. In the arrangement 1310, the layout illustrated may be sequentially repeated for subsequent logically contiguous flash pages of the flash cache (e.g., where such logically contiguous flash pages may store MD for tracks of the LUN which are sequential and logically contiguous).

In the example 1320, MD1, MD2, MD3, MD4 and MD5 each denote location MD or part 2 MD of 5 different MD pages stored in the flash cache. FP1 1322, and FP2 1324 denote 2 flash pages of the flash cache. In the example 1320, MD for 2½ MD pages fits within a single flash page. In this arrangement of 1320, each flash page may be completely filled so that the MD portions of MD pages stored in the flash cache are concatenated one immediately after the other in flash pages of the flash cache. In such an arrangement, at least one embodiment may select the data movement size to be the number of tracks or MD objects, such as 42 tracks, stored in a single MD page. In such an embodiment, not every single MD page has its MD stored in a single flash page. Rather, approximately 4/5 or 80% of the MD pages may be completely stored in a single flash page and thus reading/writing two flash pages is only needed for approximately 1/5 or 20% of the MD pages. In such an embodiment using 1320, there are no unused portions of the flash pages. However, there is an additional cost incurred for a percentage of the time for those MD pages having MD spanning multiple flash pages. In the arrangement 1320, the layout illustrated may be sequentially repeated for subsequent logically contiguous flash pages of the flash cache such as noted above regarding 1310.

In an embodiment having a flash cache layout as in 1320 for the flash cache, as an alternative to having a data movement size of 42 tracks, an embodiment may select a larger data movement size based on the number of tracks or MD objects stored in multiple flash pages, F, where F is an integer greater than 1. F may denote a number of flash pages having a flash page boundary which is also a boundary of an integer number G of MD pages having their part 2 MD stored in the F flash pages. Thus, storing the MD portions in the flash cache for G MD pages is on an alignment boundary of F flash pages. (G>1). With reference to 1320, in a first step determine a flash page boundary alignment between flash pages and MD page size portions stored in the flash cache, whereby the size of F flash pages is equal to the size of G MD portions (e.g., size of G part 2 MD portions or G location MD portions) stored in the flash cache. For example, in 1320 5 MD pages have their part 2 MD stored in 2 flash pages 1322, 1324 and align on the 2 flash page boundary. As a second step, the number of tracks or MD objects having their part 2 MD stored in the 2 flash pages may be determined and used as the data movement size. In this example, the data movement size may be 210 tracks (e.g., 42 tracks/MD page*5 MD pages=210 tracks). Thus, an embodiment may read/write multiple MD pages spanning multiple flash pages in connection with a single data movement to reduce the number of writes in connection with writing the part 2 MD for MD3 that spans 2 flash pages 1322, 1325.

Put another way, an embodiment having the arrangement 1320 may determine the LCM or least common multiple of: a) the size of each MD page portion (e.g., location MD or part 2 MD) stored on flash, and b) the size of the flash page. As known in the art in arithmetic and number theory, the least common multiple (also referred to as the lowest common multiple or smallest common multiple) of two integers a and b, denoted by LCM(a, b), is the smallest positive integer that is divisible by both a and b. To further illustrate with reference to 1320, assume each MD page portion (e.g., MD1 through MD5) stored on flash, such as the size of each part 2 MD portion of each MD page, is 2K bytes. Further, assume the size of each flash page 1322, 1324 is 5K bytes. In this example, the LCM(2,5) is 10K bytes. The forgoing LCM may be expressed more formally as in EQUATION 2:

$$\text{LCM}(\text{size of each MD page portion stored in flash cache, size of flash page}) \quad \text{EQUATION 2}$$

The data movement size may be the number of tracks, or more generally MD objects, having their MD stored in the LCM=10K bytes or 2 flash pages of the flash cache (where 2 flash pages denotes the number of flash pages at the flash page boundary). As noted above, the number of tracks having their MD stored in 2 flash pages of the flash cache is 210.

Furthermore, the LCM used to determine the data movement size may be further expressed in terms of the number of tracks or MD objects as follows in EQUATION 3:

$$\text{LCM}(\text{\# MD objects in each MD page, \# MD objects in each flash page}) \quad \text{EQUATION 3}$$

With reference again to 1320, the LCM using EQUATION 3 is LCM (42, 105) which is equal to 210 tracks or MD objects as noted above.

With reference again to FIG. 17 and element 1330, shown is a third exemplary arrangement or layout of the flash cache that may be used for storing MD in an embodiment in accordance with techniques herein. In the example 1330, MD1, MD2, MD3, MD4, MD5, MD6, and MD 7 each denote location MD or part 2 MD of 7 different MD pages stored in the flash cache. FP1 1332, FP2 1334 and FP3 1336 denote 3 flash pages of the flash cache. In the example 1330, MD for 2½ MD pages fits within a single flash page as noted in connection with 1320. However, in this arrangement of 1330, there is a mixture of completely filled flash pages and partially filled flash pages of the flash cache. For example, flash pages 1332, 1334 are completely filled and flash page 1336 is partially filled with unused portion X 1338a. In such an arrangement, at least one embodiment may select the data movement size to be the number of tracks of MD objects, such as 42 tracks, stored in a single MD page. In such an embodiment, not every single MD page has its MD stored in a single flash page. Rather, approximately 6/7 or 85% of the MD pages may be completely stored in a single flash page and thus reading/writing two flash pages is only needed for approximately 1/7 or 15% of the MD pages. In the arrangement 1330, the layout illustrated may be sequentially repeated for subsequent logically contiguous flash pages of the flash cache.

As an alternative to selecting the data movement size to be 42 tracks in an embodiment having the layout of 1330, at least one embodiment may select the data movement size such as based on EQUATION 2 and EQUATION 3 noted above. For example with reference to 1330, the data movement size may be the number of tracks or MD objects having their MD stored in the 7 MD pages where the MD may be updated with 3 flash page writes. In the foregoing case, the data movement size may be 294 tracks (e.g., 42 tracks/MD pages*7 MD pages=294 tracks).

Discussed above are techniques for determining one or more data movement sizes that may be used in an embodiment in accordance with techniques herein. The data movement size may denote the amount of data moved in a single data movement at a single point in time. In such cases, the associated MD stored in the flash cache for the data movement may be updated with one or more flash pages at a point in time. As a further variation to that discussed above, rather than have the data movement size denote the amount of data moved in a single data movement at a single point in time, the data movement size may denote the total amount of data moved or relocated with respect to a group of data portions. For example, reference is made back to FIG. 16 in an example where 3 MD pages have their location MD or part 2 MD stored in a single flash page. In such an embodiment a data movement size of 126 tracks may be selected. Rather than have a single data movement of 126 tracks, such as to move a single chunk of 126 tracks in a single data movement between storage tiers, 126 tracks may denote a total size of data moved with respect to multiple data movements. MD for the 126 tracks may all be stored in the same flash page and may thus be updated as a single point in time. For example, an embodiment may perform 3 data movements at a first point in time (or within a defined time period) that collectively move tracks 1-126 of LUN X having their location MD stored in flash page A1 1230a. Each of the 3 data movements may move a different set of 42 consecutive tracks of data for a single MD page—data movement DM1 may move tracks 1-42 such as from the 10K RPM tier to the flash tier, DM2 may move tracks 43-84 such as from the 15 k RPM tier to the 10 K RPM tier, and DM 3 may move tracks 85-126 such as from the flash tier to the 10K RPM tier (based on changes in I/O workloads for such tracks). All 3 data movements may be performed within some defined time period and the associated MD of flash page A1 1230a (e.g., location information 1220) may be accordingly updated with a single write of the flash page A1 1230a after the defined time period has elapsed and all updated location MD for the 126 tracks has been received. In such an embodiment, a buffer the size of a single flash page may be used to temporarily store and accumulate MD updates to the location MD for the 126 tracks. After the 3 data movements have been completed at the end of the defined time period, the buffer contents may then be written to the flash cache to thereby update the contents of flash page A1 1230a for 126 tracks in a single write. In such an embodiment, the multiple data movements of the 126 tracks may be scheduled as a group and occur during a defined time period. Once the data movements have been completed, or the time period has otherwise elapsed, the buffer holding the updated MD for flash page 1230*a* may be written to flash. It should be noted that an embodiment may generally collect the MD updates to the flash page in a buffer as noted above and then write out the buffer when the first of any one of the following trigger events occurs:

1. when the defined time period denoting a maximum amount of time expires/elapses; and/or
2. when all MD updates to the buffer for the scheduled data movements have completed (e.g., such as when all location MD for the 126 tracks of the flash page have been updated).

It should be noted that in connection with trigger event 1 above, the defined time period may denote a maximum amount of time determined in connection with a tolerance or risk of losing any MD updates since the buffer contents may be lost if there is a power outage or other system failure prior to writing out the MD updates to the flash cache. As yet another variation in connection with trigger event 2 above, the buffer contents (MD updates) for the flash page may be written to flash responsive to a threshold number of MD objects (e.g., tracks) in the same flash page having been updated. In the particular example above, the threshold number of MD objects or tracks may be 42. However, generally, an embodiment may decide to write out the flash page with threshold denoting less than all MD updates for all tracks stored in the buffer.

In such an embodiment using buffers, an embodiment may choose to have one or more buffers each the size of a flash page. The total size of all buffers may correspond to the data movement size for a group of data movements scheduled at the same point in time and where such data movements may occur within a defined period of time. In this manner, the one or more affect buffers holding the updated location MD may be updated and written to the flash cache at the end of the defined time period. For example, with reference back to FIG. 16, an embodiment may use one or more buffers each the size of a single flash page. Each buffer may be used to buffer MD updates for a different sequence of 126 tracks of LUN X. In accordance with techniques herein, the total amount of all buffers may be equal to some integer number of flash pages holding a number of tracks equal to a collective data movement size such as determined using one of the techniques described herein where the collective data movement size denotes a total amount of data for multiple data movements performed in a defined time period. To further illustrate, with reference to FIG. 17, consider the example arrangement 1310 with a total data movement size of 84 tracks denoting the total amount of data relocated with two data movements performed in a defined time period. The 84 tracks of data or stored in logically sequential location on the LUN and all such MD for the 84 tracks fits into a single flash page (e.g., note two MD page portions stored per flash page where each MD page includes MD for 42 tracks). An embodiment may use one or more buffers each the size of a single flash page to accumulate MD updates for each sequence of 84 tracks during a time period. Upon the occurrence of a trigger event, such as a threshold or maximum amount of time elapsing, or receiving a threshold amount of MD updates (for a threshold number of tracks), each buffer including the MD updates for a single flash page may be written to flash.

In connection with the examples 1320 and 1330, the LCM as described above such as in connection with EQUATION 2 and EQUATION 3 may be used in determining the total data movement size (DM size) of multiple buffers, where each buffer is the size of one flash page. A set of multiple individual data movements may be performed within a defined time period where the total amount of data movements by the set equals the total data movement size determined using EQUATION 2 or 3. For example, with reference to 1320, 2 buffers (each the size of a flash page) may be used to accumulate MD updates for 210 logically sequential tracks of the LUN having location MD located in the 5 MD pages MD1-MD5. To move the 210 sequential tracks, the data storage optimizer may schedule a group 5 individual data movements to be performed such as within a defined time period, where each of the 5 data movements may relocate 42 of the 210 sequential tracks. Upon the occurrence of a trigger event, such as a threshold or maximum amount of time elapsing (e.g., the defined period of time), or receiving a threshold amount of MD updates (for a threshold number of tracks), each of the 2 buffers including the MD updates accumulated may be written to the flash cache.

It should be noted that in a similar manner as just described in connection with 1320, an embodiment having a flash cache layout as in 1330 may have 3 buffers each the size of a flash page to accumulate MD updates for 294 tracks (e.g., 7 MD pages*42 tracks/MD page). An embodiment may schedule 7 individual data movements collectively relocating data having a size of 294 tracks. The 7 data movements may be scheduled and expected to complete within a defined time period along with storing any location MD updates in the above-noted 3 buffers. At the end of the defined time period, all location MD updates for the 294 tracks may be stored in the 3 buffers which are then written out to the flash cache using 3 writes. In this manner, processing performed reduces the number of writes for MD pages, such as MD3, having its MD stored in multiple flash pages of the flash cache.

Figure 18:
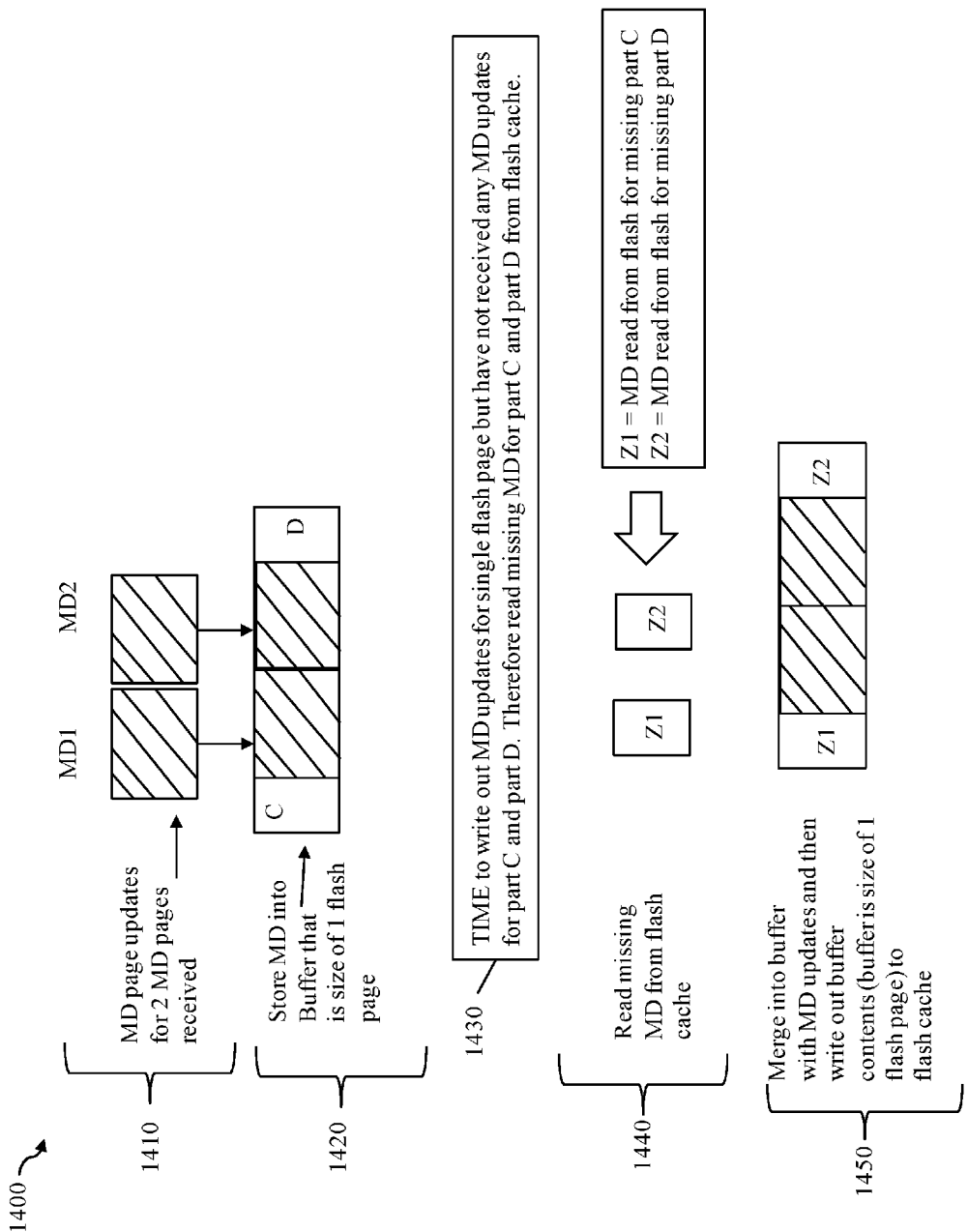
FIG. 18 is an example illustrating processing performed in connection with using buffers with metadata updates in an embodiment in accordance with techniques herein.

Referring to FIG. 18, shown is an example illustrating use of a buffer in connection with storing MD updates such as updates to MD location information, or more generally, part 2 MD, stored in the flash cache in an embodiment in accordance with techniques herein. As a first step 1410, at a first point in time, MD updates may be received for 2 MD pages, MD1, MD2. Consistent with discussion above, MD1 and M2 may each denote the location MD or part 2 MD of 2 MD pages. At step 1420, the MD updates for MD1 and MD2 may be stored into a buffer the size of a single flash page. Elements C and D in 1420 denote the portions of the single buffered flash page of MD for which no MD updates have been received. In other words, the flash page may be mapped to a sequence of MD objects such as tracks for which MD updates may be expected. However, the multiple data movements for tracks having location MD or part 2 MD mapped to the buffer may be performed at various points in time and thus the MD updates for such tracks may be made to the buffer at different points in time. At step 1430, a trigger event may occur, such as a threshold maximum amount of time may have elapsed even though no MD updates have been received for parts C and D. Thus, in step 1430, processing is performed to obtain the missing MD for parts C and D from the flash cache. At step 1440, the missing MD for parts C and D may be read from the flash cache. In this example, Z1 denotes the original MD read from the flash cache for missing part C and Z2 denotes the original MD read from the flash cache for missing part C. At step 1450, the original MD Z1 and Z2 for missing parts C and D may be merged into the buffer with the received MD updates. Element 1452 denotes the buffer contents after the foregoing merge. The contents of 1452 may then be written to the flash cache. At a later point in time, it may be that MD updates to parts C and D may be received and similarly processed and stored in the buffer of MD updates. It may be that MD updates to parts C and D were slightly delayed and received just after the threshold maximum amount of time elapsed. In such a case, it may be that no further MD updates for tracks (e.g., MD objects) mapped to the buffer are received. As described above, a trigger event may occur where the threshold maximum amount of time elapses singe there has been a write to the buffer. Processing may then proceed as described in connection with steps 1430, 1440 and 1450 with the difference that the MD updates received are for parts C and D and the missing MD read from flash is all other MD for the flash page.

Figure 19:
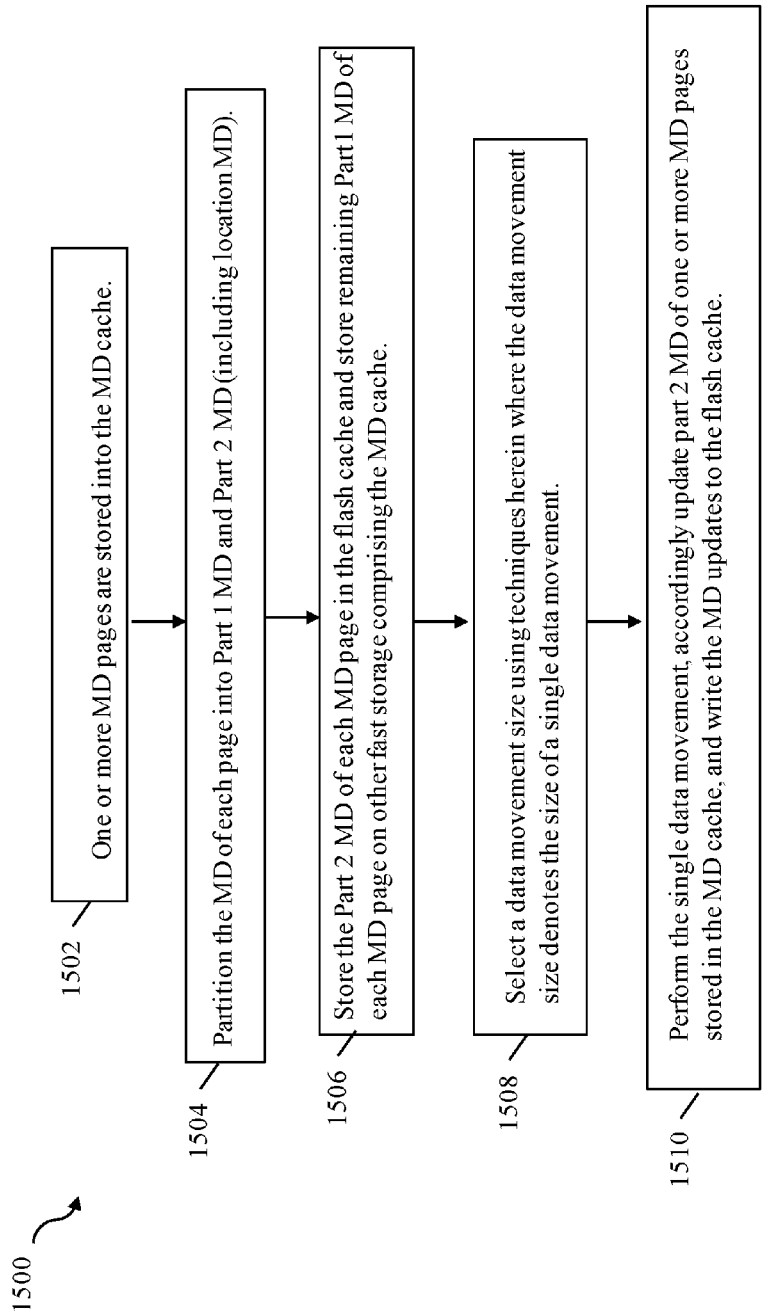
Figure 20:
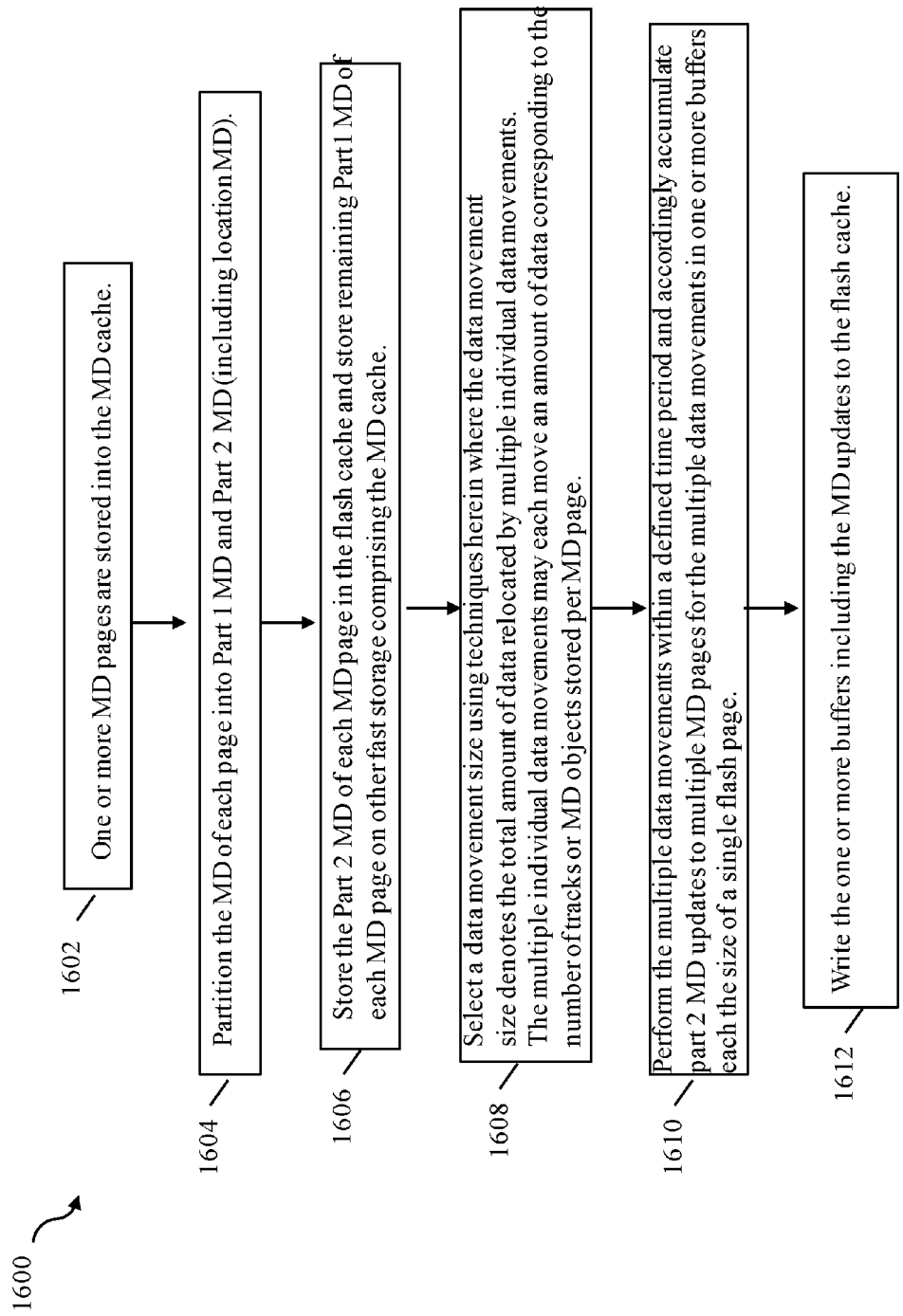

Referring to FIGS. 19 and 20, shown are flowcharts of processing steps that may be performed in an embodiment in accordance with techniques herein. The flowcharts of these figures generally summarize processing described above.

With reference to the first flowchart 1500 of FIG. 19, shown are steps that may be performed in connection with using techniques herein with a single data movement. At step 1502, one or more MD pages are stored in the MD cache. At step 1504, the MD of each cached MD page may be partitioned into Part 1 MD and Part 2 MD where the Part 2 MD may include the location MD as described above. At step 1506, the Part 2 MD of each MD page is stored persistently in the flash cache and the remaining Part 1 MD of each MD page may be stored on other fast storage comprising the MD cache. At step 1508, a data movement size may be selected using techniques as described herein where the data movement size denotes the size of a single data movement. At step 1510, the single data movement is performed, the Part 2 MD of one or more cached MD pages is accordingly updated for the single data movement, and the Part 2 MD updates are written to the flash cache.

With reference to the second flowchart 1600 of FIG. 20, shown are steps that may be performed in connection with using techniques herein with performing multiple data movements such as within a defined time period. As an example discussed above, the multiple data movements may be a set of scheduled data movements determined by the data storage optimizer where the data movements may be performed within a defined time period. Steps 1602, 1604 and 1606 are respectively similar to steps 1502, 1504 and 1506 of FIG. 19. At step 1608, a data movement size may be selected using techniques as described herein where the data movement size denotes the total amount of data relocated by multiple individual data movements. The multiple individual data movements may each move an amount of data corresponding to the number of tracks or MD objects stored per MD page. At step 1610, the multiple data movements may be performed within a defined time period. As part of step 1610, the part 2 MD updates to multiple MD pages for the multiple data movements are accordingly accumulated in one or more buffers each the size of a single flash page. At step 1612, the one or more buffers accumulating the part 2 MD updates are written to the flash cache.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method of performing data movements comprising:
   determining a data movement granularity size in accordance with a first set of one or more values including M denoting a number of storage units having associated metadata stored in a single cached metadata page of a metadata cache, wherein at least a portion of the associated metadata is stored on one or more non-volatile physical storage devices of the metadata cache each having an expected lifetime based on any of a number of writes and write cycles performed, wherein the metadata cache includes cached metadata that is paged in and out of the metadata cache in pages each the size of the single cached metadata page, wherein M is an integer greater than zero;
   selecting a first data portion for data movement, the first data portion having a size equal to the data movement granularity size, said first data portion having first metadata stored on the one or more non-volatile physical storage devices of the metadata cache, wherein the data movement is one of a plurality of data movements each moving an amount of data that is equal to the data movement granularity size and each moving data between different ones of a plurality of storage tiers of non-volatile physical storage devices providing back-end persistent data storage;
   updating, in accordance with the data movement of the first data portion, the first metadata for the first data portion and generating updated first metadata for the first data portion;
   writing, in a single write operation, the updated first metadata to the one or more non-volatile physical storage devices of the metadata cache; and
   performing the data movement of the first data portion.

2. The method of claim 1, wherein the one or more non-volatile physical storage devices are flash-based storage devices.

3. The method of claim 2, wherein the first set of one or more values includes N and Y, wherein N denotes a number of cached metadata pages having metadata stored in a single flash page, said single flash page having a size Y denoting a write size granularity of the flash-based storage devices whereby data is written to the flash-based storage devices in chunks each having the write size granularity, wherein N and Y are integers greater than zero.

4. The method of claim 3, wherein the data movement granularity size is less than Y.

5. The method of claim 3, wherein the data movement granularity size is any of: M, and a mathematical product of M*N*I, wherein I as an integer greater than zero.

6. The method of claim 1, wherein the data movement is movement of the first data portion in connection with performing any of: a data storage movement optimization that moves the first data portion from a source storage tier to a target storage tier, a data storage service or facility, data replication, creating or maintaining a snapshot, and creating or maintaining a complete physical copy of a primary data entity.

7. The method of claim 1, wherein the data movement relocates the first data portion from a first physical location in a first storage tier of the plurality of storage tiers to a second physical location in a second storage tier of the plurality of storage tiers, the first metadata includes first location information indicating that the first data portion is located at the first physical location in the first storage tier, and the updated first metadata includes second location information indicating that the first data portion is located at the second physical location in the second storage tier, said first location information indicating physical location of the first data portion prior to the data movement and the second location information indicating physical location of the first data portion after performing the data movement.

8. The method of claim 7, wherein the first storage tier and the second storage tier are included in the plurality of storage tiers having a relative performance ranking.

9. The method of claim 8, wherein the data movement is any of: a data promotion where the second storage tier has a higher performance ranking than the first storage tier, and a data demotion where the first storage tier has a higher performance ranking than the second storage tier.

10. The method of claim 2, wherein the first data portion includes a first plurality of data portions and the data movement includes a first plurality of data movements, each of the first plurality of data movements moving one of the first plurality of data portions from a source storage tier of the plurality of storage tiers to a target storage tier of the plurality of storage tiers, said target storage tier being determined in accordance with an I/O workload of said one data portion.

11. The method of claim 10, further comprising:
storing the updated first metadata in a buffer, wherein as each of the first plurality of data movements are performed, corresponding metadata of the buffer for said each data movement is updated.

12. The method of claim 11, wherein the buffer has a first size equal to a single flash page, the first size being a write size granularity in which data is written to the flash-based storage devices.

13. The method of claim 12, wherein, said updating of the buffer generates the updated first metadata for the first data portion and said updating commences at a first point in time, and wherein said writing is performed responsive to an occurrence of a trigger condition that is any of: the buffer reaches a threshold level of metadata updates, and a maximum amount of time has elapsed.

14. The method of claim 2, wherein Y is a size of each single flash page of the flash-based storage and denotes a write size granularity of the flash-based storage whereby data is written to the flash-based storage in chunks each having the write size granularity, and wherein each unit of storage of the first portion has its metadata partitioned into a first part and a second part, wherein the first metadata for the first data portion is stored in a single first flash page of the flash-based memory and the first metadata includes only the first part for each unit of storage of the first portion and the second part of each unit of storage of the first portion is stored on another form of physical storage other than the flash-based storage devices, wherein Y is an integer greater than zero.

15. A non-transitory computer readable medium comprising code stored thereon that, when executed, performs a method of performing data movements comprising:
determining a data movement granularity size in accordance with a first set of one or more values including M denoting a number of storage units having associated metadata stored in a single cached metadata page of a metadata cache, wherein at least a portion of the associated metadata is stored on flash-based storage of the metadata cache, wherein the metadata cache includes cached metadata that is paged in and out of the metadata cache in pages each the size of the single cached metadata page;
determining a total data movement size having a total size that is a least common multiple of "a" and "b", wherein "a" is a number of storage units having metadata stored in a single cached metadata page and "b" is a number of storage units having metadata stored in a single flash page, wherein the single flash page denotes an amount of data written to flash-based storage in a single write operation;
determining a first plurality of data movements each moving an amount of data equal to the data movement granularity size and each moving data between different ones of a plurality of storage tiers of non-volatile physical storage devices providing back-end persistent data storage, said first plurality of data movements having first metadata stored on the flash-based storage of the metadata cache, said first plurality of data movements moving a total amount of data equal to the total data movement size;
updating, in accordance with the first plurality of data movements, the first metadata and generating updated first metadata for the first plurality of data movements, wherein said updating includes accumulating, during a defined time period, updates to the first metadata in a plurality of buffers each having a size of the single flash page;
responsive to any of: the defined time period elapsing and completing updates to the metadata in accordance with the first plurality of movements, writing contents of each of the plurality of buffers in a single write operation to the flash-based storage of the metadata cache; and
performing the first plurality of data movements, wherein "a", "b" and M are integers greater than zero.

16. The non-transitory computer readable medium of claim 15, wherein the first metadata includes location information indicating physical storage locations of data moved by the first plurality of data movements, each of said physical storage locations denoting a location on physical storage of the plurality of storage tiers of non-volatile physical storage devices providing back-end persistent data storage.

17. A system comprising:
a processor; and
a memory comprising code stored therein that, when executed, performs a method comprising:
determining a data movement granularity size in accordance with a first set of one or more values including M denoting a number of storage units having associated metadata stored in a single cached metadata page of a metadata cache, wherein at least a portion of the associated metadata is stored on one or more non-volatile physical storage devices of the metadata cache each having an expected lifetime based on any of a number of writes and write cycles performed, wherein the metadata cache includes cached metadata that is paged in and out of the metadata cache in pages each the size of the single cached metadata page;
selecting a first data portion for data movement, the first data portion having a size equal to the data movement granularity size, said first data portion having first metadata stored on the one or more non-volatile physical storage devices of the metadata cache, wherein the data movement is one of a plurality of data movements each moving an amount of data that is equal to the data movement granularity size and each moving data between different ones of a plurality of storage tiers of non-volatile physical storage devices providing back-end persistent data storage;

updating, in accordance with the data movement of the first data portion, the first metadata for the first data portion and generating updated first metadata for the first data portion;

writing, in a single write operation, the updated first metadata to the one or more non-volatile physical storage devices of the metadata cache; and performing the data movement of the first data portion, wherein M is an integer greater than zero.

18. The system of claim 17, wherein the one or more non-volatile physical storage devices are flash-based storage devices.

19. The system of claim 18, wherein the first set of one or more values includes N and Y, wherein N denotes a number of cached metadata pages having metadata stored in a single flash page, and wherein said single flash page has a size Y denoting a write size granularity of the flash-based storage devices whereby data is written to the flash-based storage devices in chunks each having the write size granularity, wherein N and Y are integers greater than zero.

* * * * *

UNITED STATES PATENT AND TRADEMARK OFFICE
CERTIFICATE OF CORRECTION

| | |
|---|---|
| PATENT NO. | : 9,836,243 B1 |
| APPLICATION NO. | : 15/086439 |
| DATED | : December 5, 2017 |
| INVENTOR(S) | : Andrew Chanler et al. |

It is certified that error appears in the above-identified patent and that said Letters Patent is hereby corrected as shown below:

In the Claims

Column 42, Line 53, should read:
-- M*N*I, wherein I in an integer greater than zero --

Signed and Sealed this
Twenty-second Day of May, 2018

Andrei Iancu
*Director of the United States Patent and Trademark Office*